United States Patent
Yuan

(10) Patent No.: US 7,402,886 B2
(45) Date of Patent: Jul. 22, 2008

(54) MEMORY WITH SELF-ALIGNED TRENCHES FOR NARROW GAP ISOLATION REGIONS

(75) Inventor: Jack H. Yuan, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/251,400

(22) Filed: Oct. 14, 2005

(65) Prior Publication Data

US 2006/0108648 A1   May 25, 2006

Related U.S. Application Data

(63) Continuation-in-part of application No. 10/996,030, filed on Nov. 23, 2004.

(51) Int. Cl.
  *H01L 29/00* (2006.01)
(52) U.S. Cl. .................. 257/510; 257/464; 257/522; 257/E21.545; 438/424; 438/431
(58) Field of Classification Search ......... 438/424–427, 438/400, 438; 257/510, 522, 464
  See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan | |
| 5,095,344 A | 3/1992 | Harari | |
| 5,168,465 A | 12/1992 | Harari | |
| 5,172,338 A | 12/1992 | Mehrota | |

(Continued)

FOREIGN PATENT DOCUMENTS

EP    0555039    9/1998

(Continued)

OTHER PUBLICATIONS

Y. Takeuchi, et al., "A Self-Aligned STI Process Integration for Low Cost and Highly Reliable 1Gbit Flash Memories," 1998 Symposium on VLSI Technology—Digest of Technical Papers, Jun. 9-11, 1998, pp. 102.

(Continued)

*Primary Examiner*—Dung A. Le
(74) *Attorney, Agent, or Firm*—Vierra Magen Marcus & DeNiro LLP

(57) ABSTRACT

Self-aligned trench filling is used to isolate devices in high-density integrated circuits. A deep, narrow trench isolation region is formed in a substrate between devices. The trench region includes two trench portions. A first trench portion, located above a second trench portion, is filled with a deposited dielectric. The second trench portion is filled with a grown dielectric. Filling the lower trench portion by growing a dielectric material provides for an even distribution of dielectric material within the lower portion. Filling the upper trench portion by depositing a dielectric material provides for an even distribution of material in the upper portion while also protecting against encroachment of the dielectric into device channel regions, for example. Devices can be fabricated by etching the substrate to form the trench region after or as part of etching one or more layers formed above the substrate for the device. This can ensure alignment of the gate and channel regions of a device between trench isolation regions.

5 Claims, 16 Drawing Sheets

U.S. PATENT DOCUMENTS

| | | | |
|---|---|---|---|
| 5,198,380 A | 3/1993 | Harari | |
| 5,268,318 A | 12/1993 | Harari | |
| 5,268,319 A | 12/1993 | Harari | |
| 5,297,148 A | 3/1994 | Harari et al. | |
| 5,313,421 A | 5/1994 | Guterman | |
| 5,315,541 A | 5/1994 | Harari | |
| 5,343,063 A | 8/1994 | Yuan | |
| 5,346,842 A | 9/1994 | Bergemont | |
| 5,380,672 A | 1/1995 | Yuan | |
| 5,464,999 A | 11/1995 | Bergemont | |
| 5,512,505 A | 4/1996 | Yuan | |
| 5,528,547 A | 6/1996 | Aritome et al. | |
| 5,534,456 A | 7/1996 | Yuan | |
| 5,554,553 A | 9/1996 | Harari | |
| 5,579,259 A | 11/1996 | Samachisa | |
| 5,595,924 A | 1/1997 | Yuan | |
| 5,640,032 A | 6/1997 | Tomioka | |
| 5,650,345 A | 7/1997 | Ogura et al. | |
| 5,654,217 A | 8/1997 | Yuan | |
| 5,661,053 A | 8/1997 | Yuan | |
| 5,661,055 A | 8/1997 | Hsu et al. | |
| 5,677,872 A | 10/1997 | Samachisa | |
| 5,680,345 A | 10/1997 | Hsu et al. | |
| 5,712,179 A | 1/1998 | Yuan | |
| 5,712,180 A | 1/1998 | Guterman et al. | |
| 5,747,359 A | 5/1998 | Yuan | |
| 5,756,385 A | 5/1998 | Yuan | |
| 5,786,988 A | 7/1998 | Harari | |
| 5,847,425 A | 12/1998 | Yuan | |
| 5,867,429 A | 2/1999 | Chen | |
| 5,883,409 A | 3/1999 | Guterman | |
| 5,895,253 A * | 4/1999 | Akram | 438/424 |
| 5,923,976 A | 7/1999 | Kim | |
| 5,965,913 A | 10/1999 | Yuan | |
| 5,976,950 A | 11/1999 | DiSimone et al. | |
| 5,981,335 A | 11/1999 | Chi | |
| 5,999,448 A | 12/1999 | Kurihara | |
| 6,008,526 A | 12/1999 | Kim | |
| 6,028,336 A | 2/2000 | Yuan | |
| 6,033,970 A | 3/2000 | Park | |
| 6,046,935 A | 4/2000 | Takeuchi et al. | |
| 6,057,580 A | 5/2000 | Watanabe et al. | |
| 6,103,573 A | 8/2000 | Harari | |
| 6,151,248 A | 11/2000 | Harari | |
| 6,166,409 A | 12/2000 | Ratnam | |
| 6,177,317 B1 | 1/2001 | Huang et al. | |
| 6,177,333 B1 | 1/2001 | Rhodes | |
| 6,204,122 B1 | 3/2001 | Joo | |
| 6,208,545 B1 | 3/2001 | Leedy | |
| 6,222,225 B1 | 4/2001 | Nakamura et al. | |
| 6,222,762 B1 | 4/2001 | Guterman et al. | |
| 6,232,646 B1 | 5/2001 | Sun et al. | |
| 6,235,586 B1 | 5/2001 | Au | |
| 6,239,003 B1 | 5/2001 | Rao et al. | |
| 6,251,750 B1 | 6/2001 | Lee | |
| 6,258,665 B1 | 7/2001 | Shimizu | |
| 6,268,249 B1 | 7/2001 | Ha | |
| 6,274,419 B1 | 8/2001 | Omid-Zohor | |
| 6,281,075 B1 | 8/2001 | Yuan et al. | |
| 6,294,423 B1 | 9/2001 | Malik et al. | |
| 6,297,097 B1 | 10/2001 | Jeong | |
| 6,417,538 B1 | 7/2002 | Choi | |
| 6,429,076 B1 | 8/2002 | Ratnam | |
| 6,440,817 B2 * | 8/2002 | Trivedi | 438/424 |
| 6,455,889 B2 | 9/2002 | Sakui | |
| 6,512,262 B2 | 1/2003 | Watanabe et al. | |
| 6,512,263 B1 | 1/2003 | Yuan | |
| 6,579,777 B1 | 6/2003 | Yen | |
| 6,620,681 B1 | 9/2003 | Kim et al. | |
| 6,657,251 B1 | 12/2003 | Meguro | |
| 6,689,658 B2 | 2/2004 | Wu | |
| 6,700,159 B2 | 3/2004 | Kobayashi | |
| 6,713,834 B2 | 3/2004 | Mori et al. | |
| 6,762,092 B2 | 7/2004 | Yuan | |
| 6,856,001 B2 | 2/2005 | Rhodes | |
| 6,881,994 B2 | 4/2005 | Lee et al. | |
| 6,888,755 B2 | 5/2005 | Harari et al. | |
| 6,894,930 B2 | 5/2005 | Chien | |
| 6,897,522 B2 | 5/2005 | Harari et al. | |
| 6,903,434 B2 | 6/2005 | Shrivastava | |
| 6,921,688 B2 | 7/2005 | Shrivastava | |
| 6,925,007 B2 | 8/2005 | Harari et al. | |
| 6,936,887 B2 | 8/2005 | Harari | |
| 2002/0096704 A1 | 7/2002 | Fukumoto et al. | |
| 2002/0190312 A1 * | 12/2002 | Lee | 257/321 |
| 2003/0001204 A1 | 1/2003 | Kobayashi | |
| 2003/0030089 A1 * | 2/2003 | Sumino et al. | 257/298 |
| 2003/0080370 A1 | 5/2003 | Harari et al. | |
| 2003/0143815 A1 | 7/2003 | Shimizu | |
| 2004/0099900 A1 | 5/2004 | Tadashi | |
| 2004/0212006 A1 | 10/2004 | Harari | |
| 2005/0072999 A1 | 4/2005 | Matamis | |
| 2005/0162927 A1 | 7/2005 | Chien | |
| 2005/0180186 A1 | 8/2005 | Lutze et al. | |
| 2005/0218445 A1 | 10/2005 | VanDuuren | |
| 2006/0108647 A1 | 5/2006 | Yuan | |
| 2006/0110880 A1 | 5/2006 | Yuan | |

FOREIGN PATENT DOCUMENTS

| | | |
|---|---|---|
| EP | 0509697 | 9/1999 |

OTHER PUBLICATIONS

Seiichi Aritome, "Advanced Flash Memory Technology and Trends for File Storage Application," 2000 International Electron Devices Meeting, Dec. 10-13, 2000, pp. 33.1.1-33.1.4.

Non-Final Office Action, United States Patent & Trademark Office, U.S. Appl. No. 10/996,030, filed Nov. 23, 2004, Aug. 7, 2007.

Non-Final Office Action, United States Patent & Trademark Office, U.S. Appl. No. 11/251,386, filed Oct. 14, 2005, Jun. 1, 2007.

Kato, Masataka, et al., "A Shallow-Trench-Isolation Flash Memory Technology with a Source-Bias Programming Method," IEDM, 1996, pp. 177-180.

Response to Non-Final Office Action, U.S. Appl. No. 11/251,386, filed Oct. 14, 2005, Nov. 30, 2007.

Final Office Action, United States Patent & Trademark Office, U.S. Appl. No. 11/251,386, filed Oct. 14, 2005, Jan. 25, 2008.

Notice of Allowance and Fee(s) Due, United States Patent & Trademark Office, U.S. Appl. No. 10/996,030, filed Nov. 23, 2004, Jan. 28, 2008.

Response to Non-Final Office Action, U.S. Appl. No. 10/996,030, filed Nov. 23, 2004, Dec. 13, 2007.

Notice of Allowance and Fee(s) Due, United States Patent & Trademark Office, U.S. Appl. No. 11/251,386 filed on Oct. 14, 2005, May 14, 2008.

Response to Final Office Action, U.S. Appl. No. 11/251,386 filed on Oct. 14, 2005, Apr. 25, 2008.

* cited by examiner

MEMORY WITH SELF-ALIGNED TRENCHES FOR NARROW GAP ISOLATION REGIONS

PRIORITY CLAIM

The present application is a continuation-in-part application of U.S. patent application Ser. No. 10/996,030, entitled "SELF-ALIGNED TRENCH FILLING WITH HIGH COUPLING RATIO," by Jack H. Yuan, filed Nov. 23, 2004, incorporated by reference herein in its entirety.

CROSS-REFERENCE TO RELATED APPLICATIONS

The following applications are cross-referenced and incorporated by reference herein in their entirety:

U.S. patent application Ser. No. 11/251,386, entitled, "SELF-ALIGNED TRENCH FILLING FOR NARROW GAP ISOLATION REGIONS," by Jack H. Yuan, filed concurrently.

BACKGROUND OF THE INVENTION

1. Field of the Invention

Embodiments of the present invention are directed to high density semiconductor devices, such as nonvolatile memory, and systems and methods for isolating components in high density semiconductor devices.

2. Description of the Related Art

Integrated circuits are constructed by electrically connecting multiple isolated devices that share a common substrate. When multiple devices are formed on or in a common substrate, it is necessary to isolate the individual devices using isolation technology. As the density of integrated circuits continues to increase, the space available for isolating devices tends to decrease. With decreased device dimensions, inter-device parasitic currents and charges can become more problematic, making isolation technology a critical component of integrated circuit fabrication.

For example, in nonvolatile semiconductor memory devices such as flash memory, many individual storage elements are constructed from a common substrate to form a memory array. These individual storage elements must be isolated from one another using isolation technology. In one example of a flash memory system, the NAND structure is used. The NAND structure includes multiple transistors arranged in series, sandwiched between two select gates. The transistors in series and the select gates are referred to as a NAND string. Isolation technologies are typically employed during the device fabrication process to provide electrical isolation between adjacent NAND strings sharing a common substrate.

Numerous techniques exist for isolating devices in NAND flash memory and other types of semiconductor devices. In Local Oxidation of Silicon (LOCOS) techniques, an oxide is grown or deposited on the surface of a substrate, followed by the deposition of a nitride layer over the oxide layer. After patterning these layers to expose the desired isolation areas and cover the desired active areas, a trench is etched into these layers and a portion of the substrate. An oxide is then grown on the exposed regions. The grown oxide typically grows under the deposited nitride causing the encroachment of oxide into the active regions (often referred to as a bird's beak). This encroachment can cause stresses and ultimately defects in the silicon. Furthermore, the encroachment decreases the available active area for constructing devices which limits the density that can be achieved in the integrated circuit. Additionally, the LOCOS technique can cause alignment issues since the trench is formed prior to forming layers such as the conductive layer used to fabricate the floating gate of a device. The subsequently formed floating gate material may not properly align between two predefined trenches.

Improvements to these processes have been made by employing such techniques as sidewall-masked isolation (SWAMI) to decrease encroachment into active areas. In SWAMI, a nitride is formed on the trench walls prior to forming the oxide to decrease the oxide's encroachment and formation of bird's beaks. While this process provides an improvement to conventional LOCOS, the nitride in the trench rises during oxidation, causing encroachment into the active areas. This technique also yields excessive stress in the corners of the trench since oxide growth in that region is restrained. Moreover, the trenches are formed prior to device fabrication leading to the aforementioned alignment issues.

Accordingly, there is a need for isolation technology that can effectively isolate devices in high density semiconductor integrated circuits while addressing the shortcomings of the prior art identified above.

SUMMARY OF THE INVENTION

Self-aligned trench filling to isolate devices regions in high-density integrated circuits is provided. A deep, narrow trench isolation region is formed in a substrate between devices. The trench region includes two trench portions. A first trench portion, located above a second trench portion, is filled with a deposited dielectric. The second trench portion is filled with a grown dielectric. Filling the lower trench portion by growing a dielectric material provides for an even distribution of dielectric material within the lower portion. Filling the upper trench portion by depositing a dielectric material provides for an even distribution of material in the upper portion while also protecting against encroachment of the dielectric into device channel regions, for example. Devices can be fabricated by etching the substrate to form the trench region after or as part of etching one or more layers formed above the substrate for the device. This can ensure alignment of the gate and channel regions of a device between trench isolation regions.

In one embodiment, a method of fabricating a nonvolatile memory device is provided that includes forming a trench isolation region in a substrate between a first charge storage region and a second charge storage region formed above the substrate. Forming the trench isolation region includes forming a first trench portion in the substrate between the first and second charge storage regions and a second trench portion in the substrate between the first and second charge storage regions. The first charge storage region and the second charge storage region are formed prior to forming the isolation trench. A first dielectric material is deposited to at least partially fill the first trench portion. A second dielectric material is grown to at least partially fill the second trench portion.

In one embodiment, a nonvolatile memory is provided that includes a substrate, a first charge storage region formed above the substrate, and a second charge storage region formed above the substrate. The memory further includes a trench isolation region formed in the substrate between the first charge storage region and the second charge storage region. The trench isolation region includes a first trench portion and a second trench portion. The first trench portion is at least partially filled with a deposited dielectric and the second trench portion is at least partially filled with a grown dielectric.

In one embodiment, a method of fabricating an integrated circuit is provided that includes forming at least one layer above a substrate, etching through the at least one layer to define a first portion and a second portion of the at least one layer above the substrate, etching at least a first portion of the substrate to define a first trench portion in the substrate between the first portion and the second portion of the at least one layer, etching at least a second portion of the substrate to define a second trench portion in the substrate between the first and second portions of the at least one layer, depositing a first dielectric material to fill at least a portion of the first trench portion, and growing a second dielectric material to fill at least a portion of the second trench portion.

In one embodiment, an integrated circuit is provided that includes a substrate, a first portion of a layer formed above the substrate, a second portion of the layer formed above the substrate, and a trench isolation region formed in the substrate between the first and second portions of the layer. The trench isolation region includes a first trench portion and a second trench portion. The second trench portion is at least partially filled with a grown dielectric. The integrated circuit further includes a first sidewall spacer coupled to a first sidewall of the first trench portion and a second sidewall spacer coupled to a second sidewall of the first trench portion.

Other features, aspects, and objects of the invention can be obtained from a review of the specification, the figures, and the claims.

DETAILED DESCRIPTION

Figure 1:
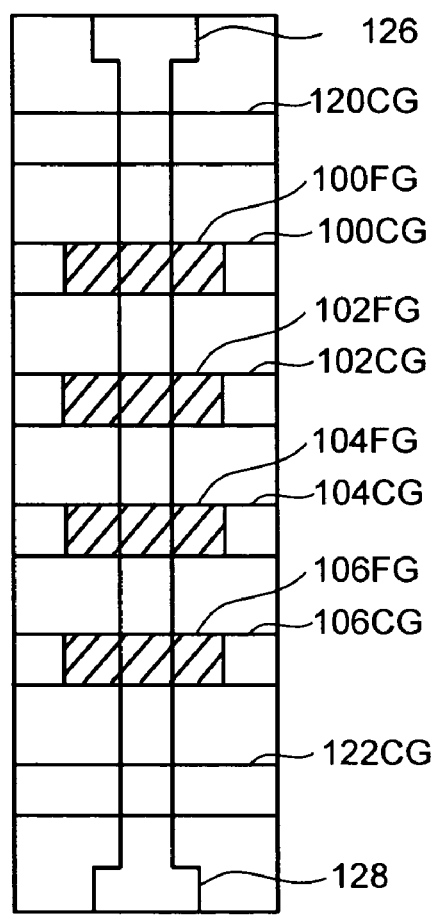
FIG. 1 is a top view of a NAND string.
Figure 2:
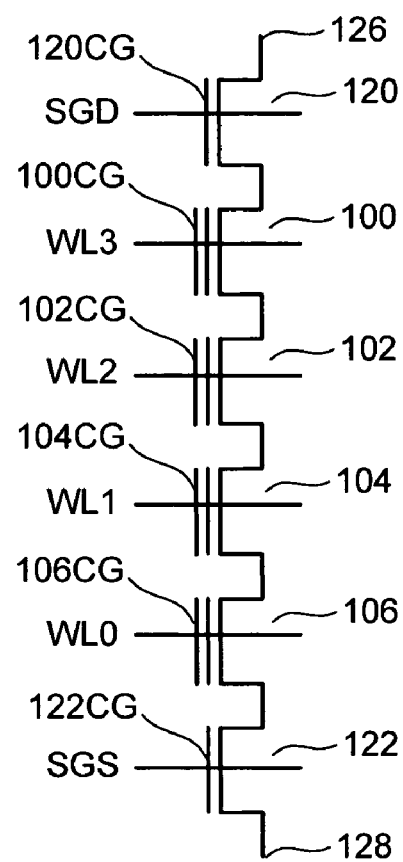
FIG. 2 is an equivalent circuit diagram of the NAND string depicted in FIG. 1.

FIG. 1 is a top view showing one NAND string. FIG. 2 is an equivalent circuit thereof. Trench isolation techniques in accordance with embodiments are presented with respect to nonvolatile flash memory and NAND type memory for purposes of explanation. It will be appreciated by those of ordinary skill in the art, however, that the techniques set forth herein are not so limited and can be utilized in many fabrication processes to fabricate various types of integrated circuits. For example, these techniques can be used in metal-oxide semiconductor (MOS) technology to isolate devices such as NMOS and PMOS transistors or circuits.

The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc.

Figure 3:
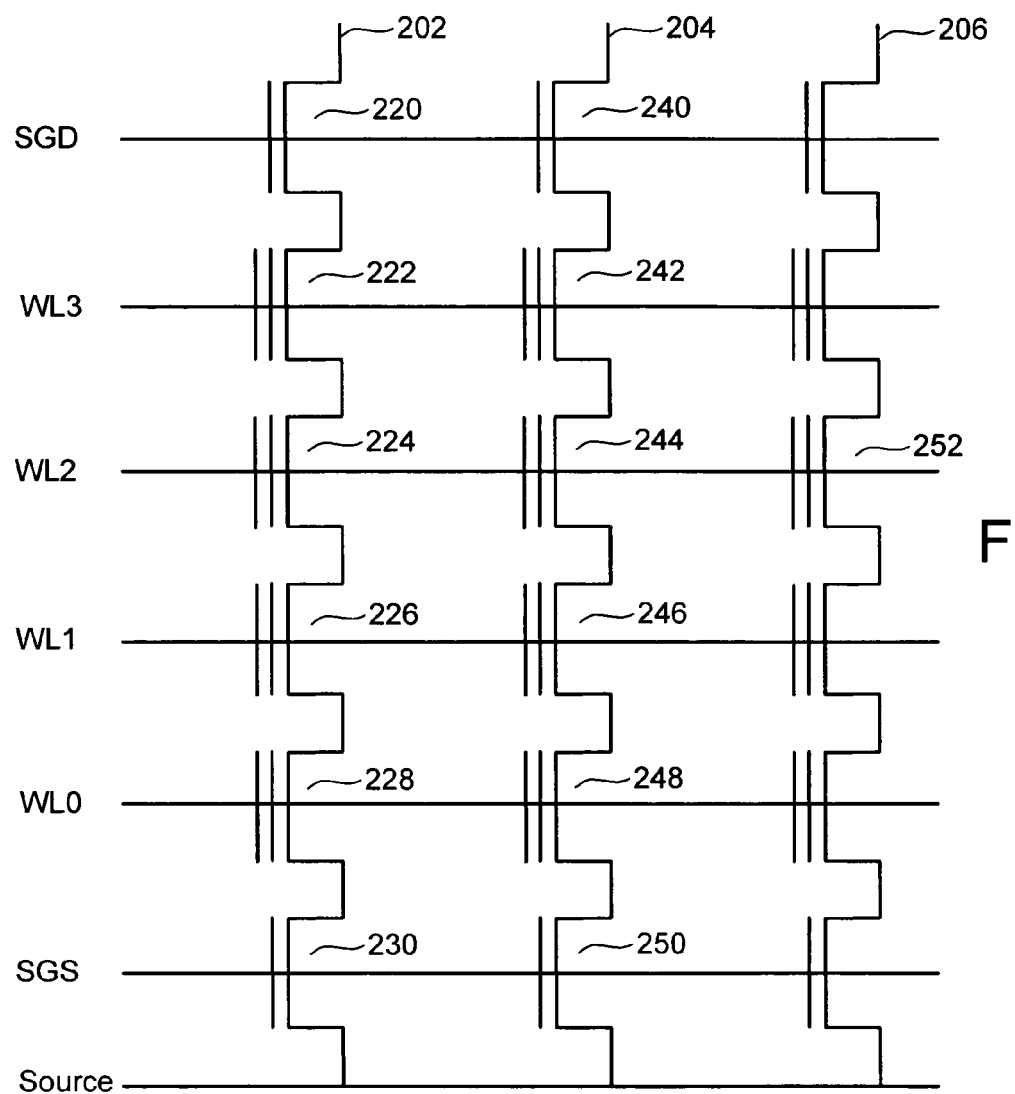
FIG. 3 is a circuit diagram depicting three NAND strings.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors and four memory cells. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. Each word line (WL3, WL2, WL1 and WL0) is connected to the control gate of one memory cell on each NAND string forming a row of cells. For example, word line WL2 is connected to the control gates for memory cell 224, 244, and 252. As can be seen, each bit line and the respective NAND string comprise the columns of the array of memory cells. In NAND structures, it is necessary to isolate the individual NAND strings and associated storage elements from one another using isolation technology.

Figure 4:
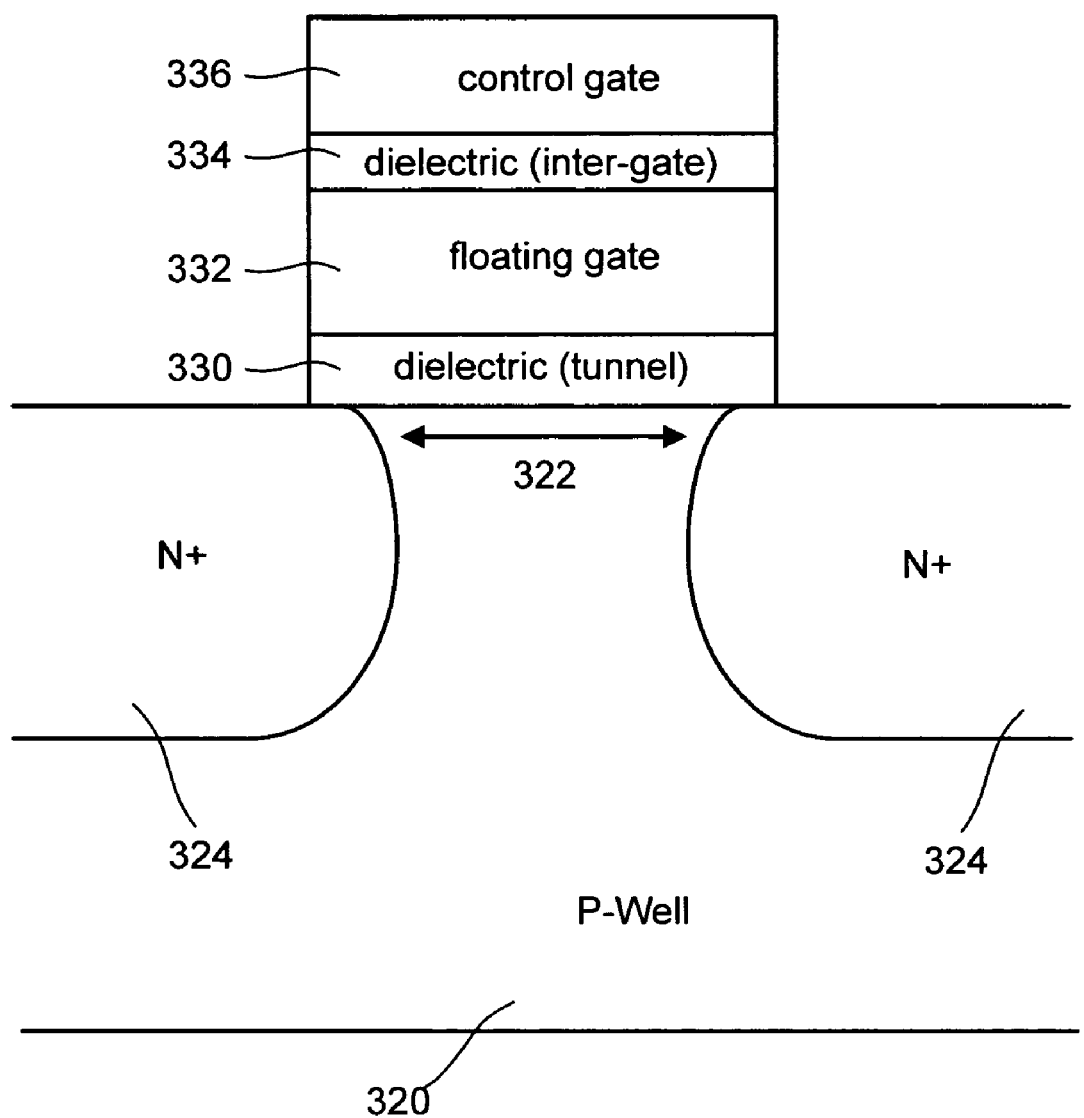
FIG. 4 is a two-dimensional block diagram of one embodiment of a flash memory cell that can be fabricated in accordance with one embodiment.

FIG. 4 is a two-dimensional block diagram of one embodiment of a flash memory cell such as those depicted in FIGS. 1-3 that can be fabricated in accordance with embodiments. The memory cell of FIG. 4 includes a triple well comprising a P-substrate, an N-well, and a P-well. The P-substrate and the N-well are not depicted in FIG. 4 in order to simplify the drawing. Within P-well 320, are N+doped regions 324, which serve as source/drain regions for the memory cell. Whether N+doped regions 324 are labeled as source regions or drain regions is somewhat arbitrary. Therefore, the N+doped source/drain regions 324 can be thought of as source regions, drain regions, or both.

Between N+doped regions 324 is a channel 322. Above channel 322 is a first dielectric area or layer 330. Above dielectric layer 330 is a conductive area or layer 332 that forms a floating gate of the memory cell. The floating gate, under low-voltage operating conditions associated with read or bypass operations, is electrically insulated/isolated from channel 322 by the first dielectric layer 330. Above floating gate 332 is a second dielectric area or layer 334. Above dielectric layer 334 is a second conductive layer 336 that forms a control gate of the memory cell. In other embodiments, various layers may be interspersed within or added to the illustrated layers. For example, additional layers can be placed above control gate 336, such as a hard mask. Together, dielectric 330, floating gate 332, dielectric 332, and control gate 336 comprise a stack. An array of memory cells will have many such stacks. As used herein, the term stack can refer to the layers of memory cells at different times during the fabrication process and thereafter. Thus, a stack can include more or fewer layers than depicted in FIG. 4 dependent upon which phase of fabrication the cell is in.

In one type of memory cell useful in flash EEPROM systems, a non-conductive dielectric material is used in place of a conductive floating gate to store charge in a nonvolatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

When programming in tunneling-based, electrically erasable programmable read-only memory (EEPROM) or flash memory devices, a program voltage is typically applied to the control gate and the bit line is grounded. Electrons from the channel are injected into the floating gate as electrons tunnel across dielectric 330. Dielectric 330 is often referred to as a tunnel dielectric or tunnel oxide. When electrons accumulate in floating gate 332, the floating gate becomes negatively charged, and the threshold voltage of the memory cell is raised to one of the threshold voltage distributions pre-defined to represent the storage of one or more bits of data. Typically, the program voltage applied to the control gate is applied as a series of pulses. The magnitude of the pulses is increased with each successive pulse by a predetermined step size.

Figure 5:
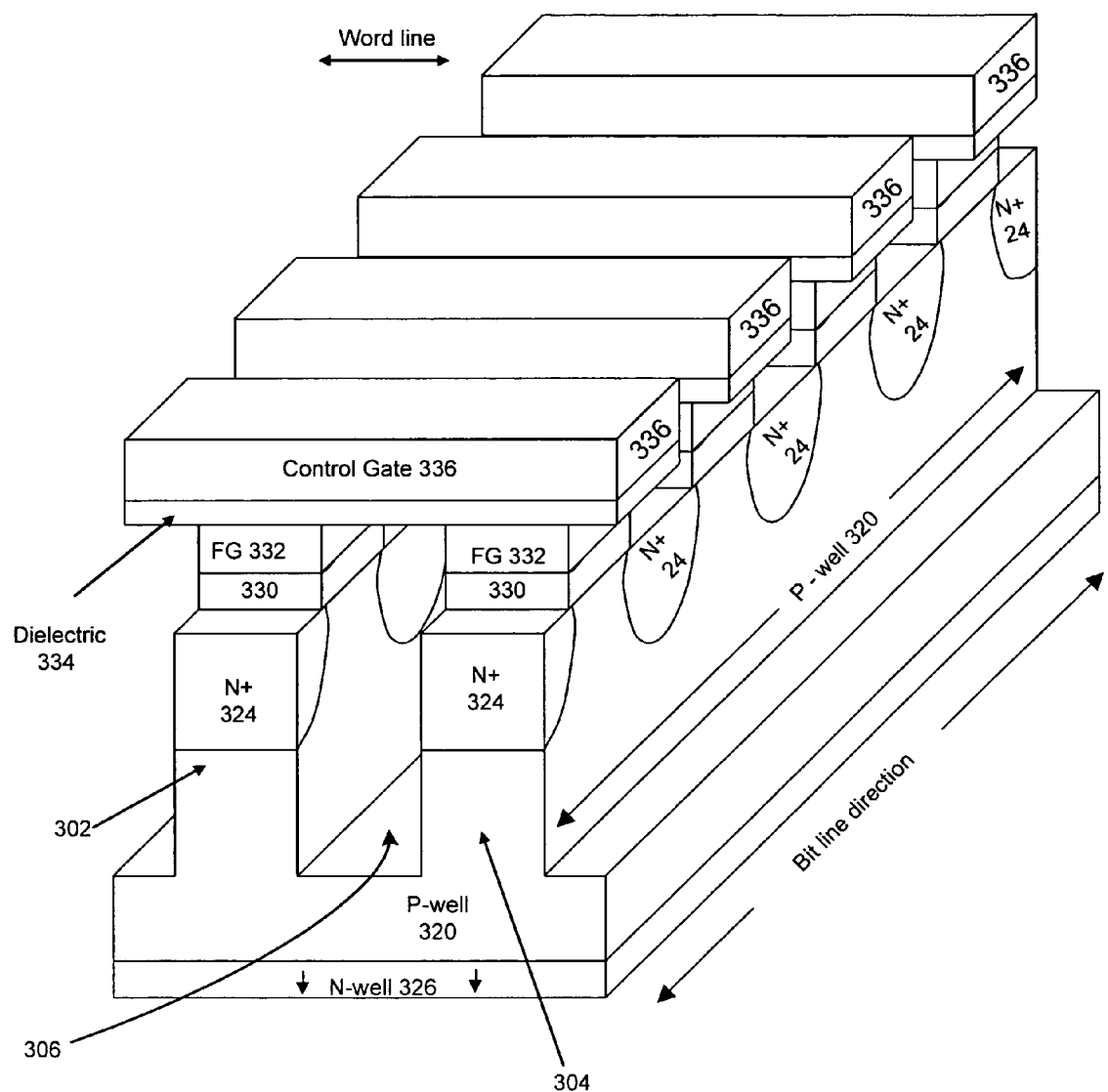
FIG. 5 is a three dimensional drawing of a pair of four word line long portions of two NAND strings that can be fabricated in accordance with one embodiment.

As previously described, when constructing semiconductor-based integrated circuits, it is necessary to provide isolation between individual devices. In the example of flash memory, it is necessary to electrically isolate select memory cells, such as that depicted in FIG. 4, from other memory cells of the storage array. FIG. 5 is a three-dimensional block diagram of two typical NAND strings 302 and 304 that may be fabricated as part of a larger flash memory array. FIG. 5 depicts four memory cells on strings 302 and 304. However, more or less than four memory cells can be used. Each of the memory cells of the NAND string has a stack as described above with respect to FIG. 4. FIG. 5 further depicts N-well 326 below P-well 320, the bit line direction along the NAND string, and the word line direction perpendicular to the NAND string. The P-type substrate below N-well 336 is not shown in FIG. 5. In one embodiment, the control gates form the word lines. A continuous layer of conductive layer 336 is formed which is consistent across a word line in order to provide a common word line or control gate for each device on that word line.

When fabricating a NAND-based nonvolatile memory system, including NAND strings as depicted in FIG. 5, it is necessary to provide electrical isolation between adjacent strings. For example, NAND string 302 must be electrically isolated from NAND string 304 in order to provide discreet devices with independent electrical characteristics. Isolation of the memory cells on NAND string 302 from the memory cells on NAND string 304 is typically accomplished by providing an electrical barrier between the strings in order to inhibit or prevent parasitic currents and charges between adjacent memory cells.

In the embodiment depicted in FIG. 5, NAND string 302 is separated from NAND string 304 by an open area or void 306. In typical NAND configurations, a dielectric material is formed between adjacent NAND strings and would be present at the position of open area 306. As previously described, many prior art techniques include forming a dielectric isolation region prior to forming the stacks for each memory cell using a LOCOS process, for example.

The ability to provide electrical isolation is often measured in terms of a field threshold. The field threshold represents the amount of charge or current that a particular isolation technique can withstand. For example, an isolation region may provide a 10 volt field threshold such that it can withstand a charge of 10 volts placed across it. In many modern nonvolatile flash memory devices, the charge levels within the circuit are continuing to increase. As device dimensions decrease, the influence of a floating gate over the channel region can decrease. To properly program nonvolatile flash memory devices having such small dimensions, high program voltages are applied to the control gates. For example, in many nonvolatile flash memory devices, a program voltage of 20 volts or more can be applied. Accordingly, it is necessary to provide a field threshold level between NAND strings, equal to or greater than the maximum expected voltage level present in the device. In addition to higher charge levels within devices, the decrease in device dimensions makes it more difficult to provide electrical isolation between devices, given the smaller amount of area within which to isolate the devices. Looking at FIG. 5, as NAND strings 302 and 304 are progressively fabricated closer and closer together, it is more difficult to provide an effective isolation therebetween.

FIGS. 6A-6L depict a sequential process for forming isolation regions between charge storage regions in an integrated circuit in accordance with one embodiment. FIG. 7 is a flow chart depicting a process for forming isolation regions during the fabrication of nonvolatile memory devices such as that depicted in FIGS. 6A-6L. FIGS. 6A-6L and FIG. 7 depict a specific example with respect to a NAND flash memory device. However, it will be appreciated by those of ordinary skill in the art that the techniques described herein are easily extendible to many types of semiconductor devices and can be incorporated with numerous types of fabrication processes. In FIGS. 6A-6L, the bit line direction, relative to the page, runs in and out of the page while the word line direction runs left to right relative to the page.

Figure 6A:
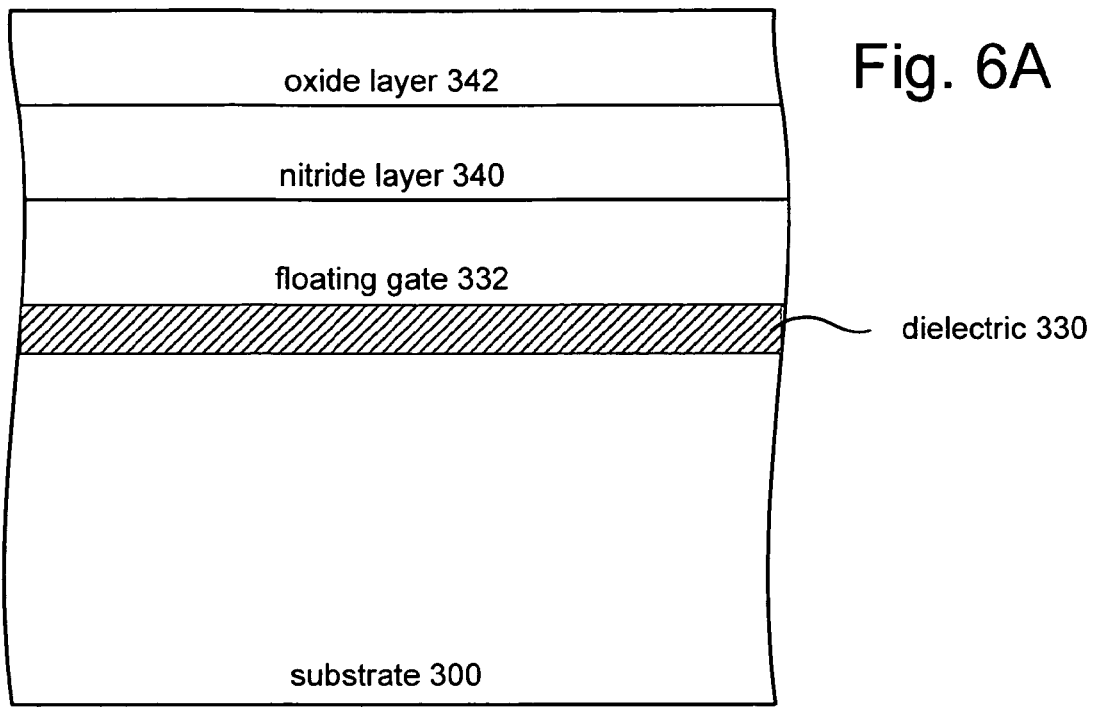
FIGS. 6A-6L depict NAND string stacks in accordance with one embodiment at various stages of a fabrication process in accordance with one embodiment.
Figure 7:
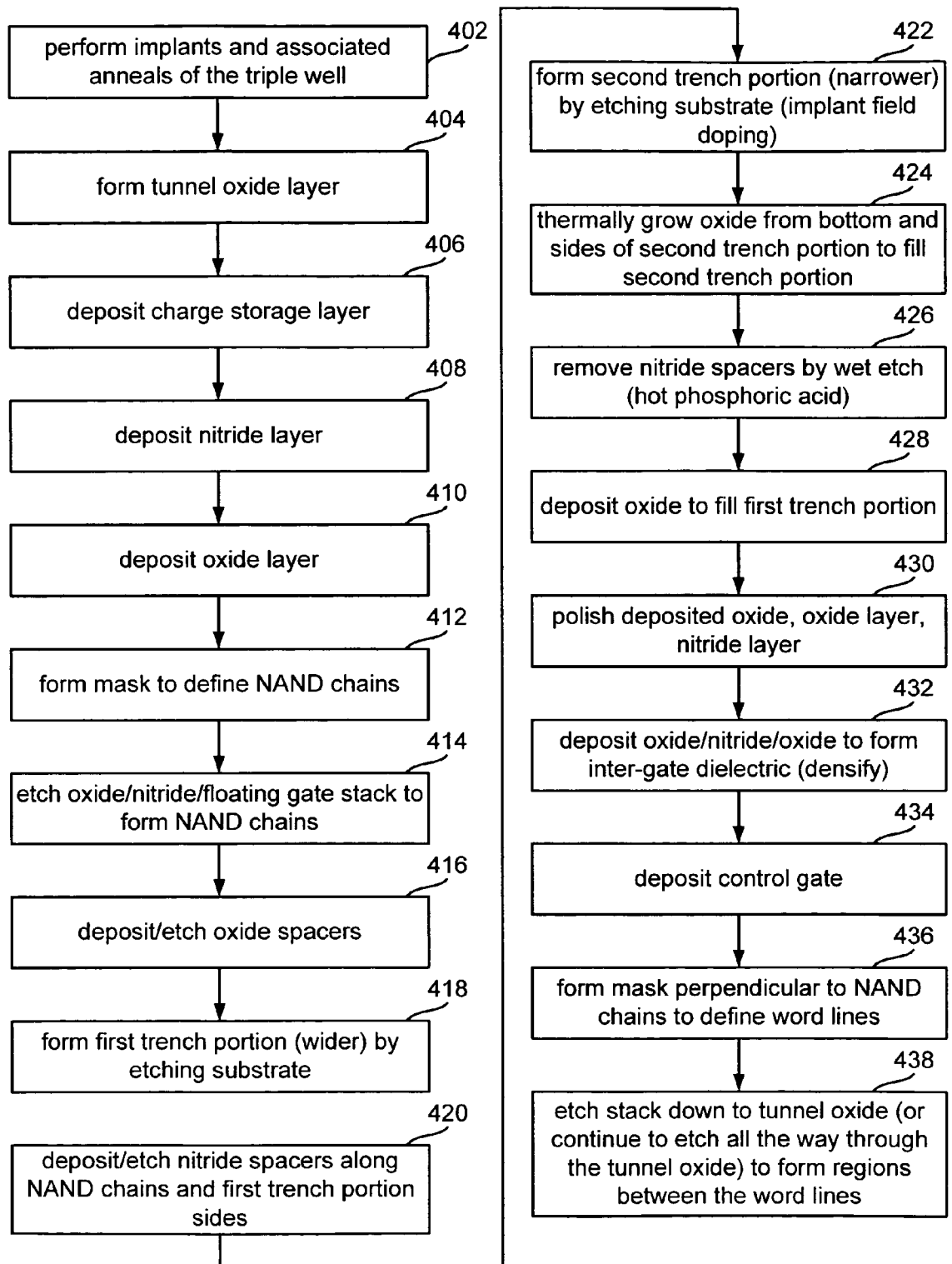
FIG. 7 is flowchart of a method of fabricating flash memory cells in accordance with one embodiment.

FIG. 6A depicts a substrate 300 on and in which multiple nonvolatile NAND-type flash memory devices are to be fabricated. Substrate 300 is used generically to represent a substrate, but can also include P-wells and/or N-wells formed therein, as appropriate for various implementations. For example, a P-well and N-well may be formed in substrate 300 as depicted in FIGS. 4 and 5.

At step 402 of FIG. 7, implanting and associated annealing of a triple well including substrate 300 is performed. After implanting and annealing the triple well, a dielectric layer 330 is formed above substrate 300 at step 404. Dielectric 330 can form the tunnel oxide of storage elements. Dielectric layer 330 can include an oxide or other suitable dielectric material in various embodiments. Dielectric layer 330 can be deposited using known chemical vapor deposition (CVD) processes, metal organic CVD processes, physical vapor deposition (PVD) processes, atomic layer deposition (ALD) processes, grown using a thermal oxidation process, or formed using another suitable process. In one embodiment, dielectric 330 is about 70-100 angstroms in thickness. However, thicker or thinner layers can be used in accordance with various embodiments. Additionally (and optionally), other materials may be deposited on, deposited under, or incorporated within the dielectric to form dielectric layer 330.

Figure 6B:
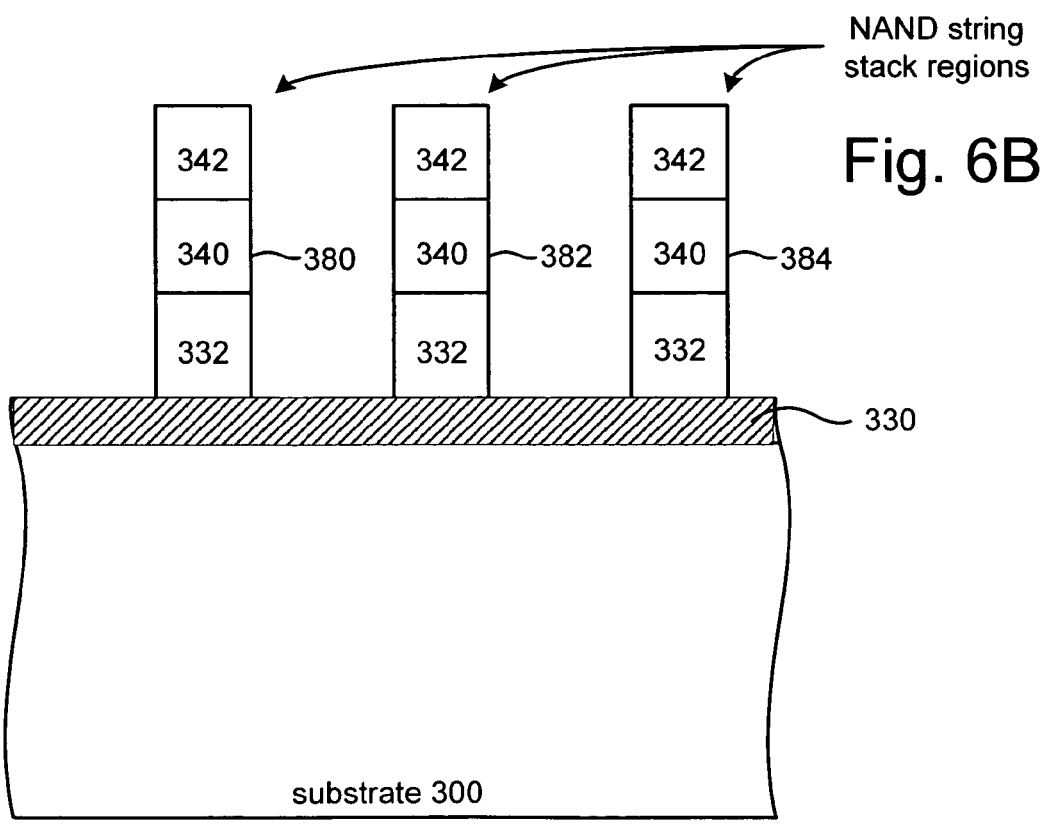

At step 406, a charge storage layer is deposited on top of the tunnel oxide layer. In FIG. 6B, the charge storage layer is first conductive layer 332 which will comprise the floating gates for the memory devices of the strings being fabricated. In one embodiment, conductive layer 332 is polysilicon deposited using known processes as described above. In other embodiments, other conductive materials can be used. In one embodiment, conductive layer 332 is about 500 angstroms in thickness. However, conductive layers thicker or thinner than 500 angstroms can be used in accordance with embodiments.

The charge storage layer deposited at step 406 can include conductive floating gate materials (e.g., polysilicon) or dielectric charge storage materials (e.g., silicon nitride). If an ONO triple layer dielectric is used, step 404 can include depositing the first silicon oxide layer and step 406 can include depositing the nitride charge storage layer. The second silicon oxide layer can be deposited in later steps to form the inter-gate dielectric (discussed hereinafter).

In one embodiment, a tailored dielectric layer is used and the charge storage regions formed therein. For example, a tailored layer of silicon rich silicon dioxide can be used to trap and store electrons. Such material is described in the following two articles, which articles are incorporated herein in their entirety by this reference: DiMaria et al., "Electrically-alterable read-only-memory using Si-rich SI02 injectors and a floating polycrystalline silicon storage layer," J. Appl. Phys. 52(7), July 1981, pp. 4825-4842; Hori et al., "A MOSFET with Si-implanted Gate-Si02 Insulator for Nonvolatile Memory Applications," IEDM 92, April 1992, pp. 469-472. As an example, the thickness of the layer can be about 500 Angstroms. Steps 404 and 406 can be combined as the tailored dielectric layer will form the tunnel dielectric layer, charge storage layer, and optionally the inter-gate dielectric layer.

After depositing the floating gate or other charge storage layer, a nitride layer 340 is deposited at step 408 and an oxide layer 342 deposited at step 410. These oxide and nitride layers serve as sacrificial layers for various later-performed steps and optionally, can form or form part of the inter-gate dielectric region for the device. Both the oxide and nitride layers can be formed using known processes, and each layer can be about 400 angstroms in thickness. However the thickness of each of these layers can be more or less than 400 angstroms in accordance with various embodiments. Layers 330, 332, 340, and 342 are preliminary NAND string stack layers that are used to form a plurality of devices. Multiple NAND strings will be constructed using these layers as starting layers.

After layers 330, 332, 340, and 342 have been formed, a hard mask can be deposited (step 412) over oxide layer 342 to begin the process of defining the individual NAND strings of the device. After depositing a hard mask over the oxide layer, photolithography can be used to form strips of photoresist over the areas to become the NAND strings. After forming the strips of photoresist, the exposed mask layers can be etched using anisotropic plasma etching, for example.

At step 414, the oxide layer, nitride layer, and floating gate layer are etched using the photoresist and mask to form the individual NAND string stack regions 380, 382, and 384. The result of such a process is depicted in FIG. 6B. FIG. 6B depicts floating gate layer 332, nitride layer 340, and oxide layer 342, after etching to form three distinct preliminary NAND string stack regions that will become individual NAND strings for the memory device. The three NAND string stack regions are adjacent to one another in the word line direction. In one embodiment, step 414 can include etching through all or a portion of dielectric layer 330.

Figure 6C:
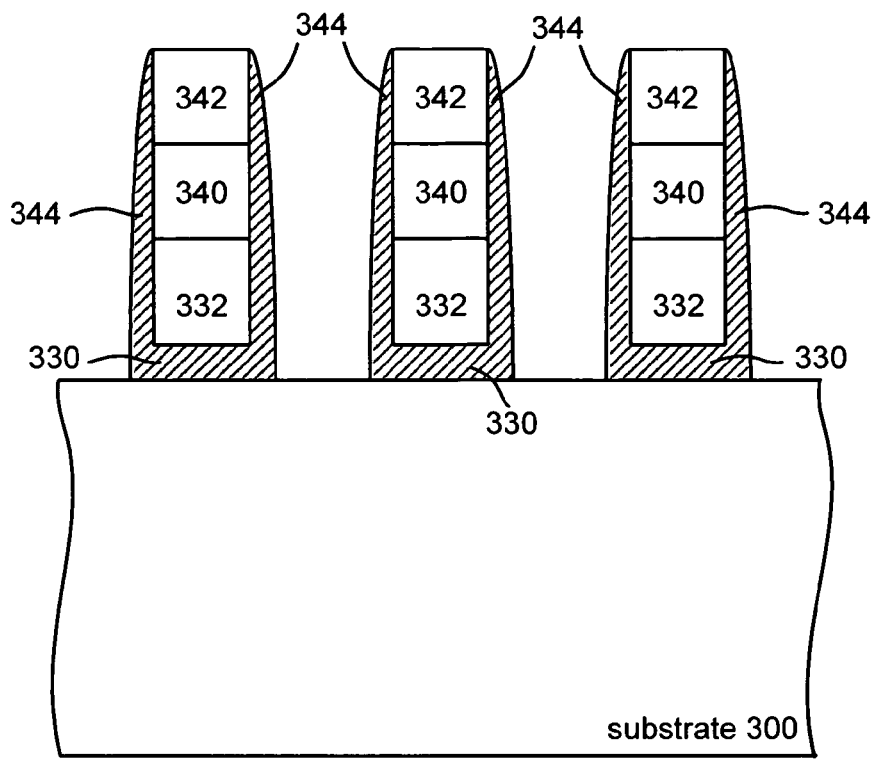

After defining the NAND string stack regions, a layer of oxide is deposited on the exposed surfaces (step 416) to form sidewall spacers for each defined string. After depositing the oxide, it is etched back from substrate 300 to form sidewall spacers 344 for each NAND string. FIG. 6C depicts oxide spacers 344 after having been deposited and etched. Sidewall spacers 344 can include multiple layers in some embodiments. For example, after depositing and etching the oxide, a layer of nitride can be deposited and etched to further define sidewall spacers 344. Dielectric 330 can also be etched at step 416 to expose those areas of substrate 300 outside the spacer and in between the preliminary stack regions. In one embodiment, dielectric 330 is etched to substrate 300 if the dielectric was not etched prior to forming the sidewall spacers.

The sidewall spacers serve as a mask for the trench region etching steps to follow in order to narrow the width of the trench regions that will be formed between adjacent NAND strings in the memory device. For example, the sidewall spacer on NAND string stack region 380 and the adjacent sidewall spacer on NAND string stack region 382 will be used to define a trench region between stack regions 380 and 382.

Figure 6D:
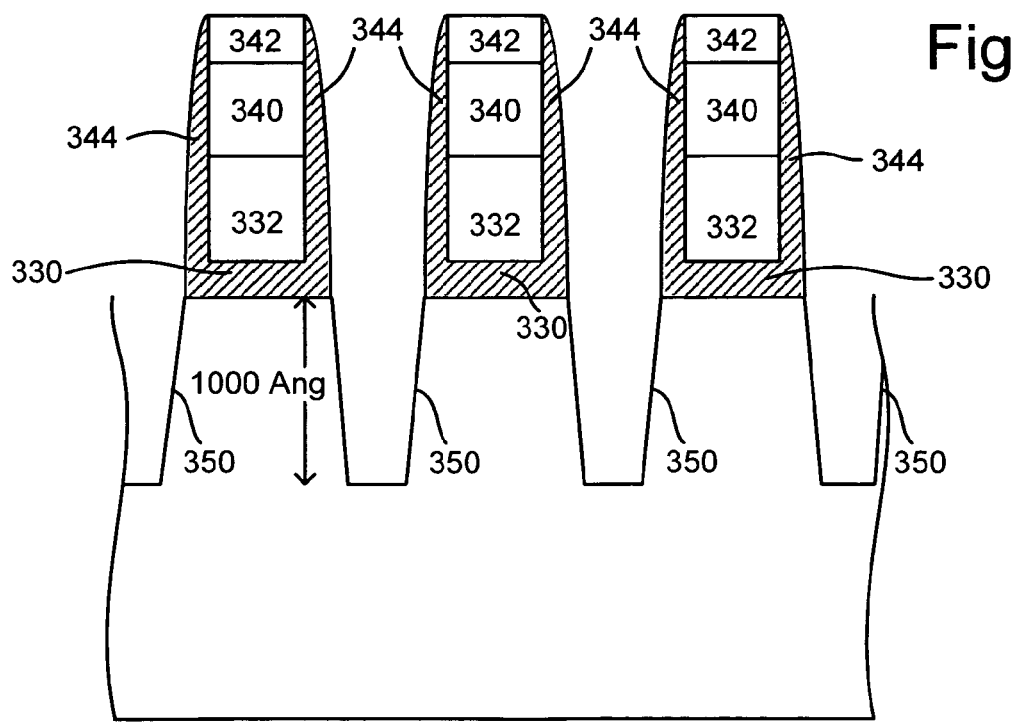

After forming the sidewall spacers, a first portion for the trench region is formed (step 418) in between adjacent NAND string stack regions by etching into substrate 300 to begin the formation of isolation regions between adjacent NAND strings. FIG. 6D depicts the substrate after etching to form first trench portions 350. The first trench portions have slanted walls which become narrower towards the bottom of the trench. Because of the formation of sidewall spacers 344 prior to etching, the width of the trench can be narrow in comparison to trenches formed using prior art techniques. In one embodiment, trenches 350 are about 1,000 angstroms deep and about 300 angstroms in width at the top. However, it will be understood by those of ordinary skill in the art, that devices of other dimensions can also be constructed in accordance with various embodiments. As illustrated in FIG. 6D, oxide layer 342 serves as a sacrificial layer for the etching process. The thickness of oxide layer 342 is decreased during the etching process.

Figure 6E:
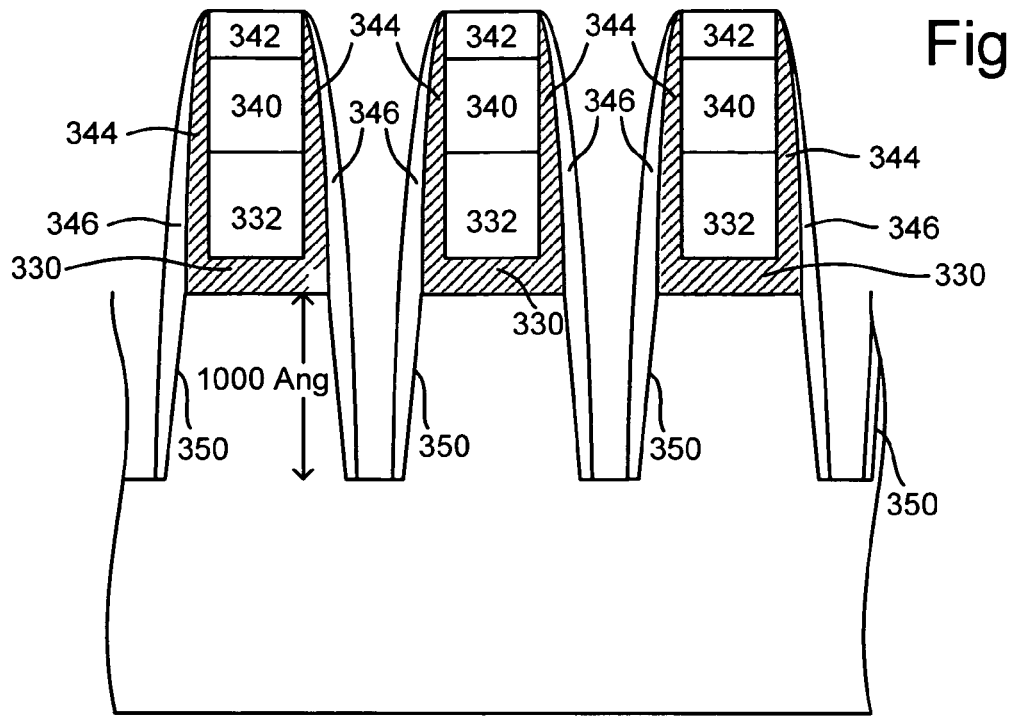

After forming first trench portions 350, a layer of nitride is deposited on the exposed surfaces (step 420) to begin formation of second sidewall spacers 346 for each defined NAND string and first trench portion. After depositing the nitride, it is etched back from substrate 300 to form second sidewall spacers 346 for each NAND string. FIG. 6E depicts nitride spacers 346 after having been deposited and etched. Sidewall spacers 346 can include multiple layers in some embodiments as previously described. The second sidewall spacers 346 serve as a mask for the second trench portion etching steps to follow. These sidewalls protect the sides of the first trench portions from etching and also narrow the width of the second trench portions that will be formed.

Figure 6F:
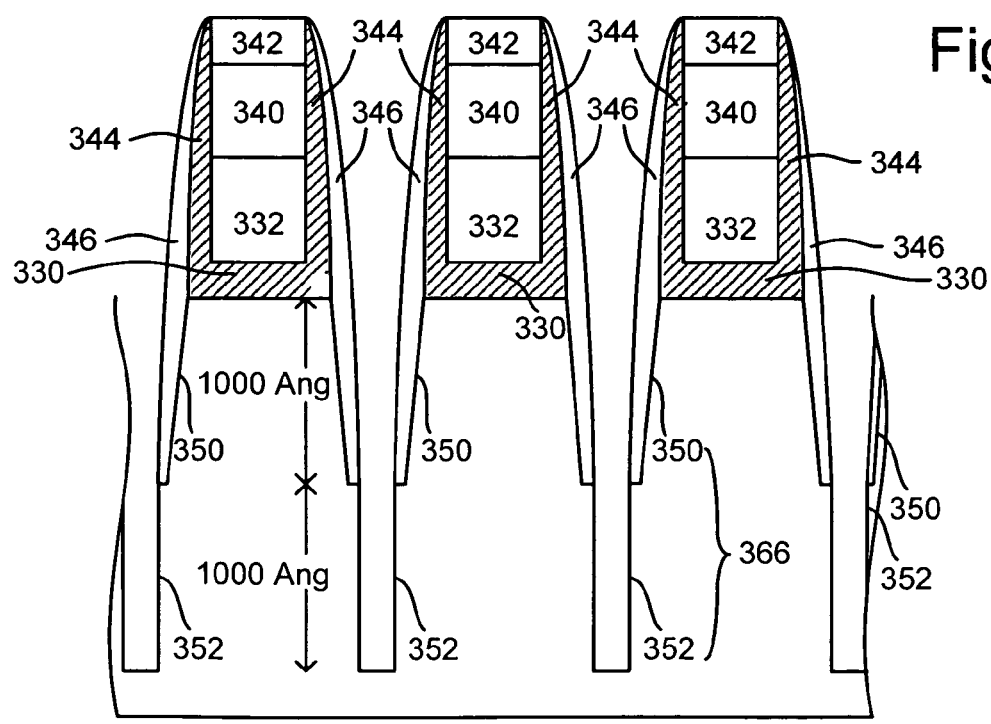

After forming the second sidewall spacers, a second trench portion is formed (step 422) in between them at the bottom of each first trench portion. Step 422 includes etching from the bottom of first trench portions 350 and in between adjacent sidewall spacers 346 to further form isolation regions between adjacent NAND strings. FIG. 6F depicts the substrate after etching to form second trench portions 352. Together, first trench portions 350 and second trench portions comprise or define trench regions 366. The second trench portions have substantially straight walls. Like first trench portions 350, the formation of sidewall spacers 346 prior to etching facilitates the formation of second trench portions that are narrower in comparison to trench regions formed using prior art techniques. In one embodiment, second trench portions 352 are about 1,000 angstroms deep and about 100-150 angstroms in width. However, it will be understood by those of ordinary skill in the art, that devices of other dimensions can also be constructed in accordance with various embodiments. Although not shown, oxide layer 342 can serve as a sacrificial layer for this etching process which may further decrease its thickness.

Step 422 can also include implanting field doping (also referred to as channel stop implant) at the bottom of second trenches 352. The field implant doping can enhance the doping at the bottom of the trench to protect from channel leakage.

The second trench portions are filled by thermally growing an oxide from the bottom and sides of the second trench portions to substantially fill the second trench portions with a grown oxide (step 424). Second sidewall spacers 346 protect the silicon sidewalls of first trench portions 350 and the NAND string stack regions from oxidation. This limits the oxide growth to within second trench portions 352. The second trench portions can be filled using known thermal growth techniques for growing oxides from a silicon substrate. For example, exposing the silicon substrate to an oxygen containing mixture will cause oxidation of the silicon, and the formation of silicon-dioxide within the trench. The silicon-dioxide will grow from both the bottom of the second trench portions and each of the sidewalls of the second trench portions. This growth process is self-limiting. The second trench portions will initially fill from the bottom due to its narrower width at that portion, and gradually fill from the bottom and the sides as the oxide is grown. This allows the process to be self-limiting. As the second trench portions are filled from the bottom and sides, the subsequent growth will be concentrated and fastest at the unfilled exposed areas. Accordingly, uniform growth of the trench filling oxide can be expected. In one embodiment, step 424 can include a combination of chemical vapor deposition and oxide growth. For example, a small thin layer of oxide can be deposited along the sidewalls and bottom of the second trench portion in order to form a cushion between the silicon substrate and subsequently grown oxide. After forming this thin layer along the walls and bottom of the second trench portion, an oxide can be grown to completely fill the second trench portion as previously described.

Because of the shape of the second trench portion and the use of a self-limiting growth process, there will be no keyhole void (hole in the oxide) near the bottom of the second trench portion as is common when trenches are filled using deposition processes. Because the oxide will grow and fill the second trench potion from the bottom first, no void will be created as can occur when a trench is filled with a deposited material as in prior art process. Growing the oxide can avoid the lack of precision in forming oxide within the trench portion that may be attendant to a deposition process. For example, depositing an oxide in such a narrow and deep trench can pose difficulty as the oxide is deposited on all exposed surfaces and may fill the upper portion before the lower portion is completely full.

Figure 6G:
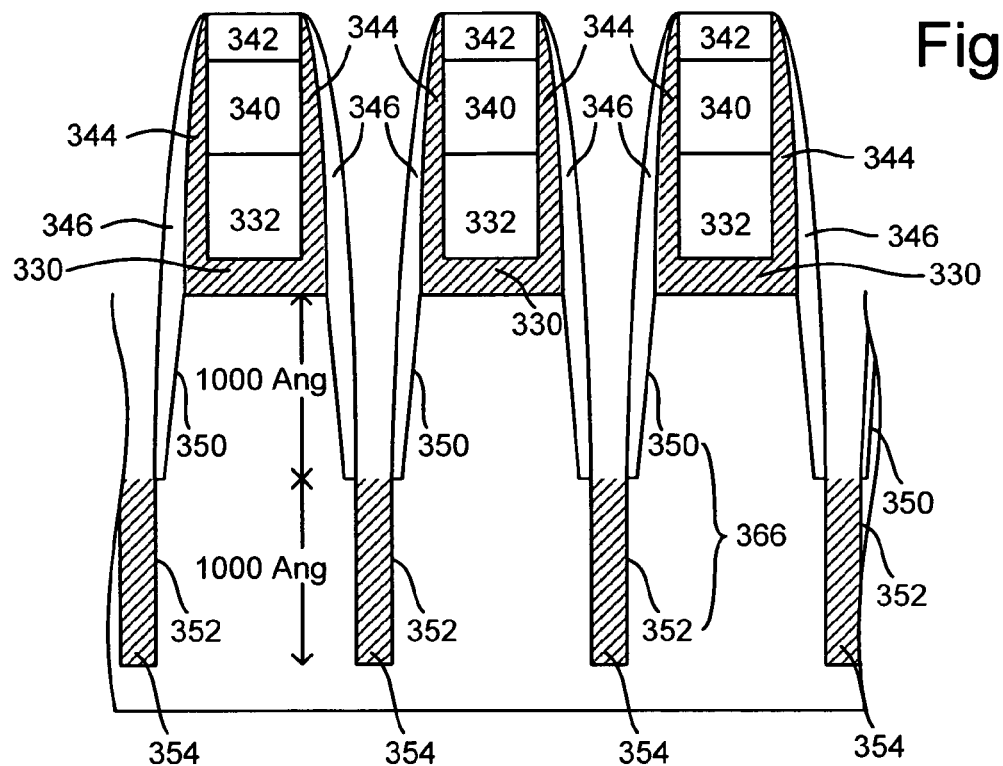

FIG. 6G illustrates the result of thermally growing oxide 354 in second trench portions 352. In some embodiments, the resulting width and depth of the silicon dioxide is wider and deeper than the originally etched second trench portions 352. The resulting width and depth is due to the silicon dioxide not only growing from the sidewalls and the bottom of the trench portion into the trench portion, but also from the silicon dioxide growing from the sidewalls and the bottom of the trench portion into substrate 300 itself. This can result in an oxide that is wider and deeper than the initial trench etched into the substrate.

Figure 6H:
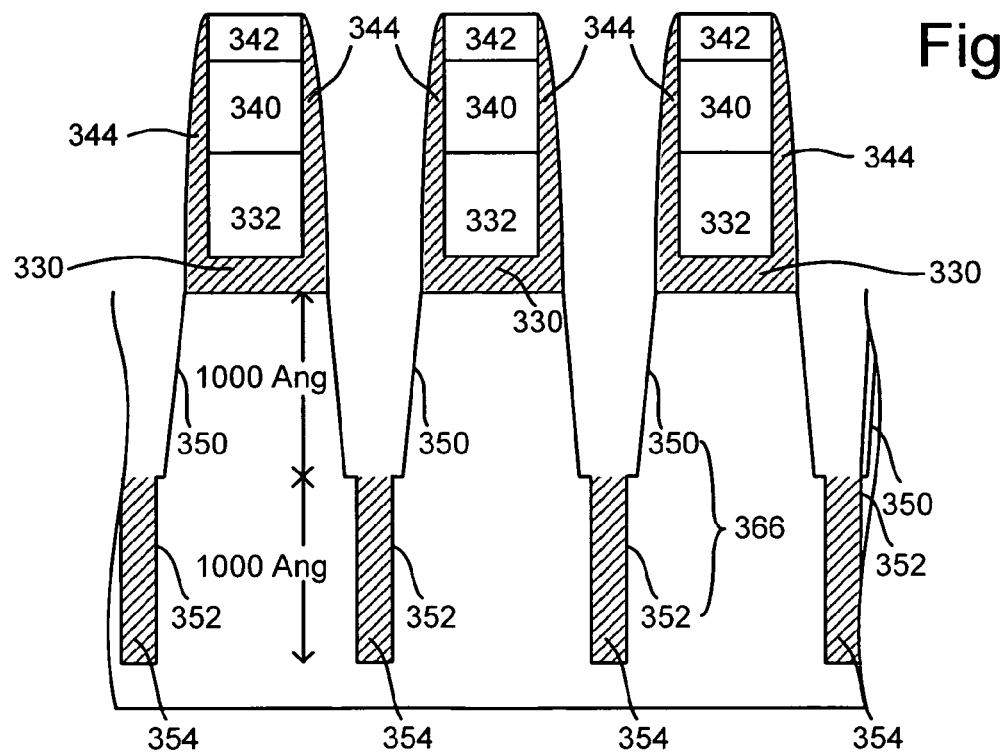

At step 426, a wet etch (e.g., hot phosphoric acid) or other suitable process can be used to remove second sidewall spacers 346 subsequent to growing the oxide in second trench portions 352. Step 426 exposes the sides of first trench portions 350 in between each NAND string stack region, as depicted in FIG. 6H.

Figure 6I:
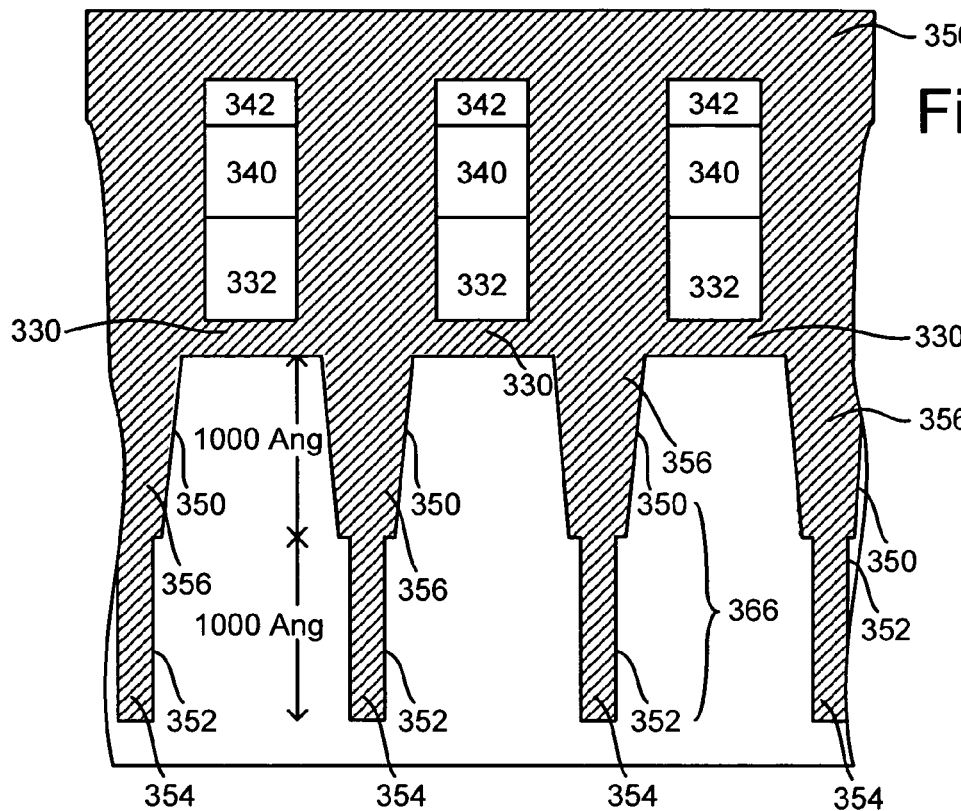

The first trench portions are then filled with deposited oxide 356 using a deposition process at step 428. Oxide 356 can be deposited using known chemical vapor deposition (CVD) processes, metal organic CVD processes, physical vapor deposition (PVD) processes, or atomic layer deposition (ALD) processes. By utilizing a deposition process to fill first trench portions 350, encroachment of oxide into the channel region of each device is avoided. The nitride spacers 346 prevent encroachment of the grown oxide when filling second trench portions 352 and the subsequent deposition avoids any encroachment that may occur were an oxide growth process used to fill both trenches. FIG. 6I depicts the result of depositing oxide 356 into first trench portions 350. The deposited oxide 356 not only fills the first trench portions, but is also is deposited on all the exposed surfaces.

Figure 6J:
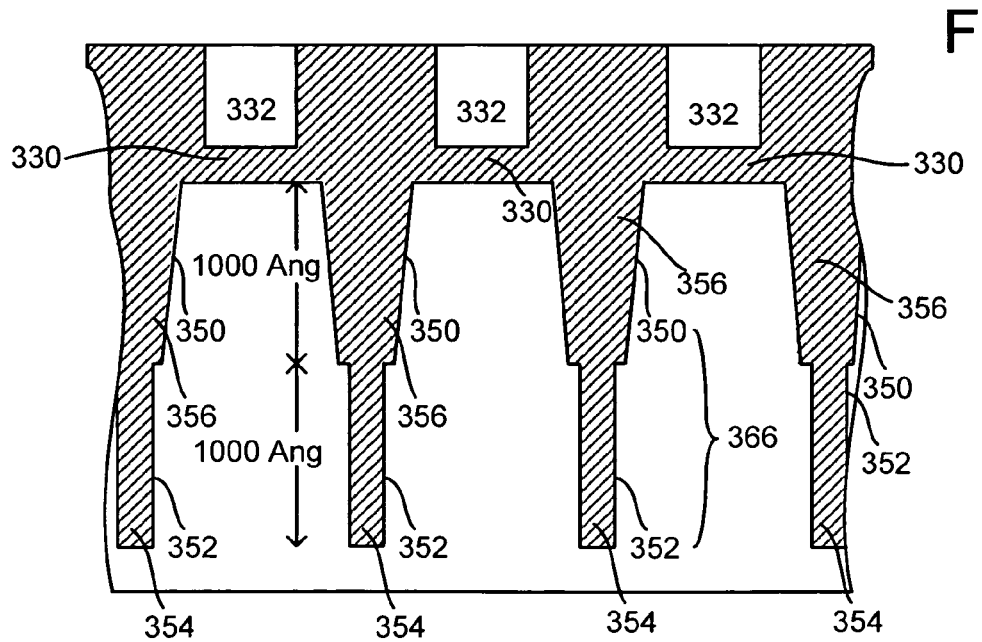

Chemical mechanical polishing (CMP) is used at step 430 to polish the deposited oxide 356. In one embodiment as shown in FIG. 6J, deposited oxide 356, oxide layer 342, and nitride layer 342 are all polished to expose floating gate 332. In other embodiments, a portion of the deposited oxide 356 can be left along with oxide layer 342 and nitride layer 340 for formation of the inter-gate dielectric. Moreover, various other alternatives exist. For example, polishing could take place until oxide layer 342 is exposed or until nitride layer 340 is exposed.

Figure 6K:
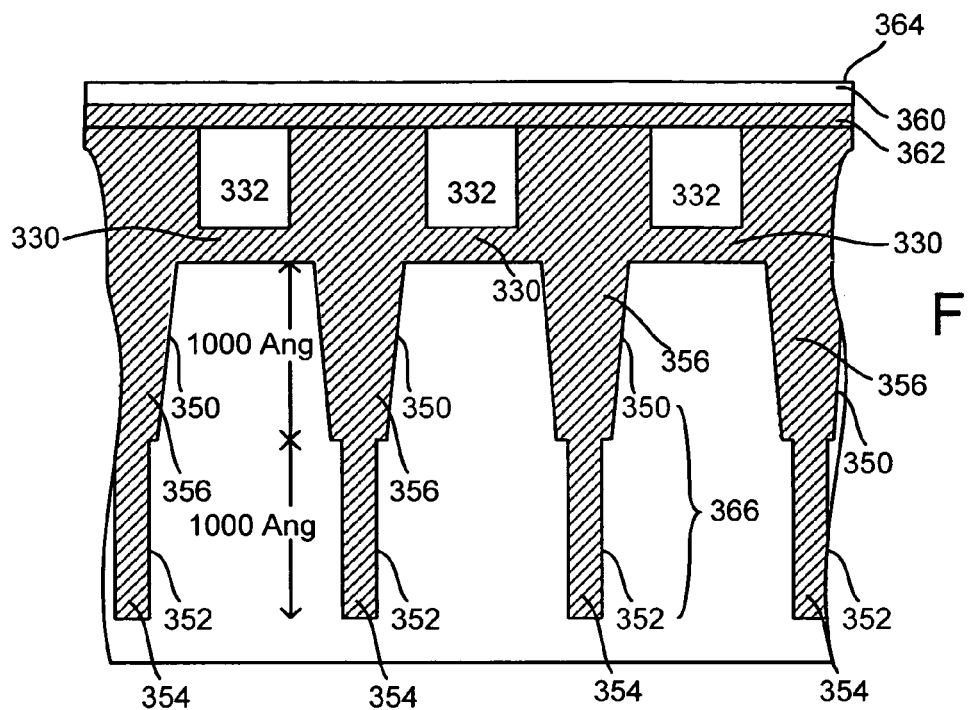
Figure 6L:
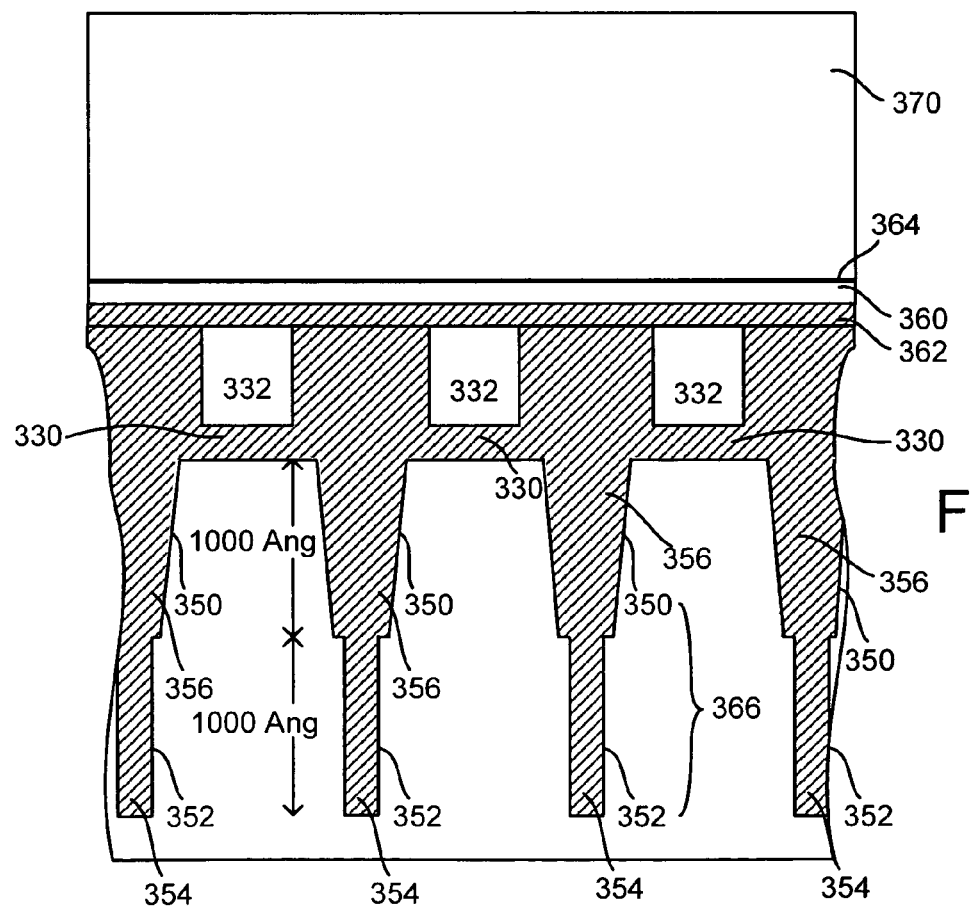

After exposing floating gate layer 332, a second dielectric layer is formed above the etched portions of floating gate layer 332 at step 432. If a dielectric nitride charge storage region is used, step 432 can include forming the last oxide layer of an ONO dielectric region. The second dielectric layer forms the inter-gate dielectric for the individual storage devices of each string. In accordance with one embodiment, the second dielectric layer is formed of multiple individual layers of dielectric material. As depicted in FIG. 6K for example, the dielectric layer can be an ONO dielectric formed of a first layer of oxide 362, a second layer of nitride 360, and a third layer of oxide 364 (oxide layer 364 is depicted on the outside of nitride layer 364, but without any substantial thickness shown in the figure). The total depth of the second dielectric layer can be about 170 angstroms. For example, oxide layer 362 can be about 50 angstroms, nitride layer 360 about 70 angstroms, and the second oxide layer 364 about 50 angstroms. In other embodiments the second dielectric layer can be greater or less than 170 angstroms and the individual layers can be greater than or less than the specified dimensions and be formed of alternate materials. In one embodiment, the dielectric layer is formed by depositing each of the oxide and nitride layers using processes such as chemical vapor deposition. The dielectric layer can be densified using known densification techniques. The combination of a 50 angstrom oxide, a 70 angstrom nitride, and a 50 angstrom oxide layer has an effective ONO thickness of about 140 angstroms.

In one embodiment, the inter-gate dielectric can be formed of various combinations of layers 356, 342, and 340. In such a case, step 432 can be skipped and the inter-gate dielectric formed by polishing one or more of layers 356, 342, and 340. If a tailored dielectric layer is used for the charge storage regions, step 432 can be skipped and the inter-gate dielectric formed by polishing to the tailored dielectric layer 332 deposited in steps 404 and 406.

After forming the second dielectric layer, a second conductive layer 370 is deposited over the exposed regions of the structure at step 428. In one embodiment, conductive layer 370 is poly-silicon and forms the control gates for multiple nonvolatile memory cells. In one embodiment, poly-silicon layer 370 is deposited to a depth of about 2000 angstroms from the top of the second dielectric layer.

After depositing control gate layer 370, the stack regions can be subdivided to form word lines that are isolated from one another. At step 436, a mask layer can be deposited on control gate layer 370 and photolithography used to form strips of photoresist perpendicular to the NAND string (formed in the word line direction). At step 438, the exposed portions of the mask and underlying layers can be etched using plasma etching, ion milling, ion etching that is purely physical etching, or another suitable process to etch the various layers and form the individual word lines by subdividing the control gate layer, the inter-gate dielectric layer, and the floating gate layers. The etched portions of the control gate layer form the individual word lines and the etched floating gate layers form the individual floating gates of the memory cells of each string. In one embodiment, etching is performed until the tunnel dielectric layer is reached. In another embodiment, etching continues through the tunnel dielectric until the substrate is reached.

The formation of narrow trenches can enable decreases in overall device dimension sizes by facilitating closer spacing of NAND strings. Because a very deep trench region is used, a high field threshold can be obtained, while still maintaining a narrow trench region width. The amount of field threshold accomplished by an isolation region using a trench region, as depicted in FIGS. 6A through 6L, is dependant upon the aspect ratio defined by the width/height ratio of the trench region. In accordance with embodiments, a deep, narrow trench region is used in order to decrease device dimension size, while also maintaining a suitable aspect ratio. Thus, a high field threshold can be maintained while decreasing device dimensions. The use of sidewall spacers (layers 344 and 346) enables a narrow trench region to be formed, while also serving as a mask, as previously described. The oxide and nitride layers will serve to constrict the etching to between the adjacent nitride spacer and/or oxide spacer layers. The top of the trench region will be narrower than the space between adjacent NAND-strings by an amount equal to twice the width of each oxide spacer layer and each nitride spacer layer.

It should be noted that the formation of charge storage layer 332 prior to etching trenches 350 avoids mis-alignment issues that may exist in prior art techniques that form an isolation region prior to forming a charge storage layer. Because the charge storage layer is formed first and etched along with the substrate to form a trench region, the trench region will be properly aligned between the charge storage regions (e.g., floating gates) of memory cells on adjacent NAND strings. In prior art techniques where the trench is formed first, care must be taken to properly form the charge storage regions between predefined isolation regions. The imprecision of growth and deposition processes may cause the charge storage region to not be properly positioned between the isolation regions. Such is not the case in accordance with embodiments herein because the charge storage region is accurately positioned in between the trench regions due to etching after forming the floating gate.

Because the charge storage layer is deposited prior to forming the trench regions, the charge storage regions will be aligned between two sets of trench regions as previously described. By virtue of this, the second dielectric layer is also self-aligned over each charge storage region and thus provides consistent coupling at each formed cell. Since etching occurs through the charge storage layer and into the substrate to form the trench regions, consistent spacing and alignment of charge storage regions is achieved. Accordingly, the control gate layer will be consistently formed for each charge storage region which leads to consistent coupling characteristics for each device. In prior art techniques where the charge storage regions are mis-aligned, the subsequently formed control gate layer may not be consistently formed above each charge storage region. This can lead to different coupling characteristics between cells.

Other variations and alternatives can be practiced while still remaining within the scope of the present disclosure. For example, the embodiments in FIGS. 6A-7 depict the first trench portions and second trench portions as having the same depth. In various embodiments, different relative depths can be used. For example, the first trench portion could be made about 500 angstroms in depth while the second trench portion made about 1500 angstroms in depth. Other actual depths can be used in other devices with different dimensions. A shallower first trench portion can be easier to fill by deposition processes such as chemical vapor deposition. In other embodiments, the first trench portions are deeper than the second trench portions.

Figure 8:
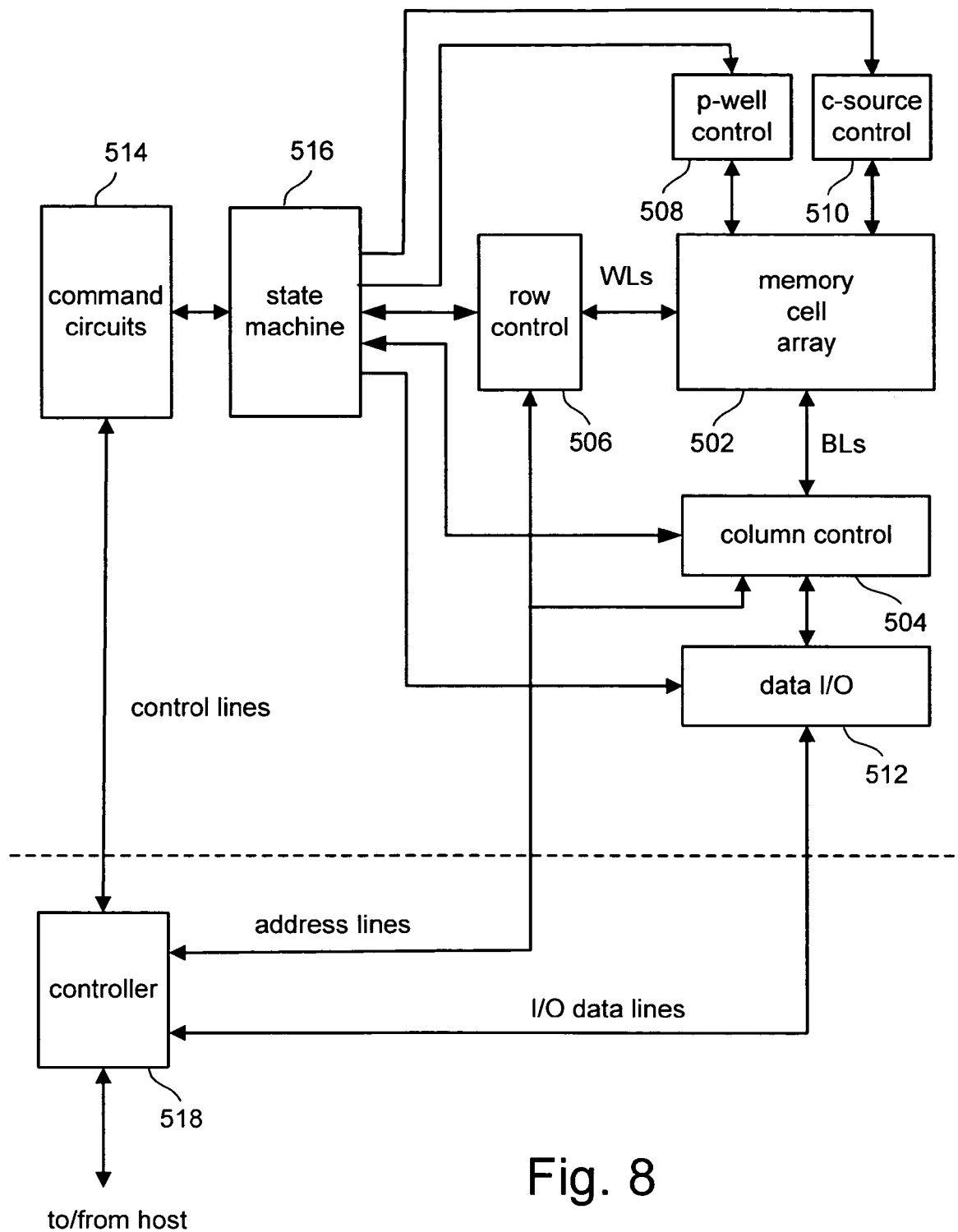
FIG. 8 is a block diagram of one example of a memory system that can be used to implement the present invention.

FIG. 8 is a block diagram of one embodiment of a flash memory system that can be used to implement embodiments. Memory cell array 502 is controlled by column control circuit 504, row control circuit 506, c-source control circuit 510 and p-well control circuit 508. Array 502 can include one or more memory cells fabricated according to embodiments set forth in FIGS. 6A-7. Column control circuit 504 is connected to the bit lines of memory cell array 502 for reading data stored in the memory cells, for determining a state of the memory cells during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. C-source control circuit 510 controls a common source line (labeled as "C-source" in FIG. 9) connected to the memory cells. P-well control circuit 508 controls the p-well voltage.

The data stored in the memory cells are read out by the column control circuit 504 and are output to external I/O lines via data input/output buffer 512. Program data to be stored in the memory cells are input to the data input/output buffer 512 via the external I/O lines, and transferred to the column control circuit 504. The external I/O lines are connected to controller 518.

Command data for controlling the flash memory device are input to controller 518. The command data informs the flash memory of what operation is requested. The input command is transferred to state machine 516 that controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected to or connectable with a host system such as a personal computer, a digital camera, or personal digital assistant, etc. It communicates with the host that initiates commands, such as to store or read data to or from the memory array 502, and provides or receives such data. Controller 518 converts such commands into command signals that can be interpreted and executed by command circuits 514, which is in communication with state machine 516. Controller 518 typically contains buffer memory for the user data being written to or read from the memory array.

One exemplary memory system comprises one integrated circuit that includes controller 518, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 9:
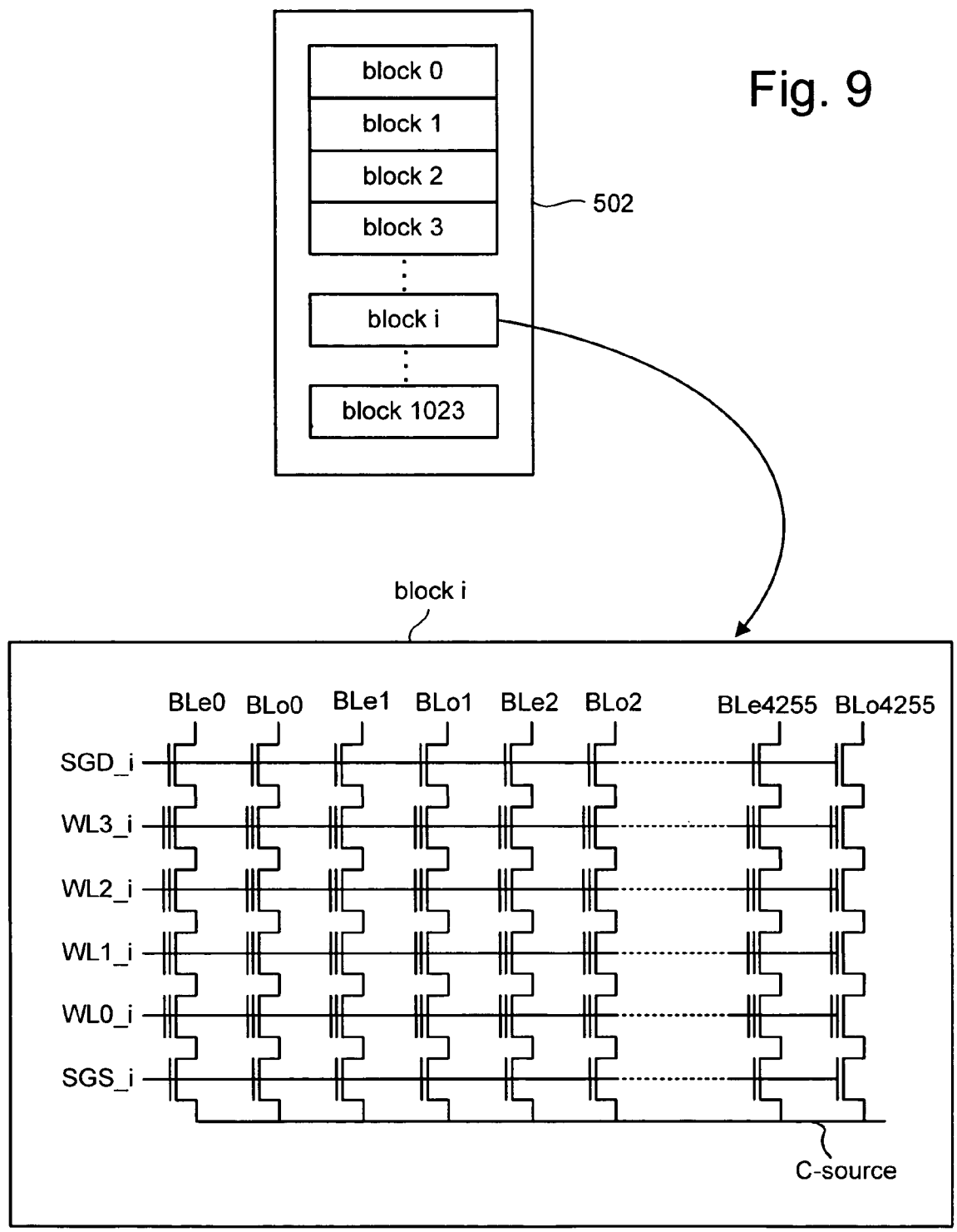
FIG. 9 illustrates an example of an organization of a memory array.

With reference to FIG. 9, an exemplary structure of memory cell array 502 is described. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 9 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that as programming progresses it is verified whether or not the threshold voltage has reached 2.4V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0 volts while the control gate receives a series of programming pulses with increasing magnitudes. In one embodiment, the magnitudes of the pulses in the series range from 7 volts to 20 volts. In other embodiments, the range of pulses in the series can be different, for example, having a starting level of higher than 7 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 10:
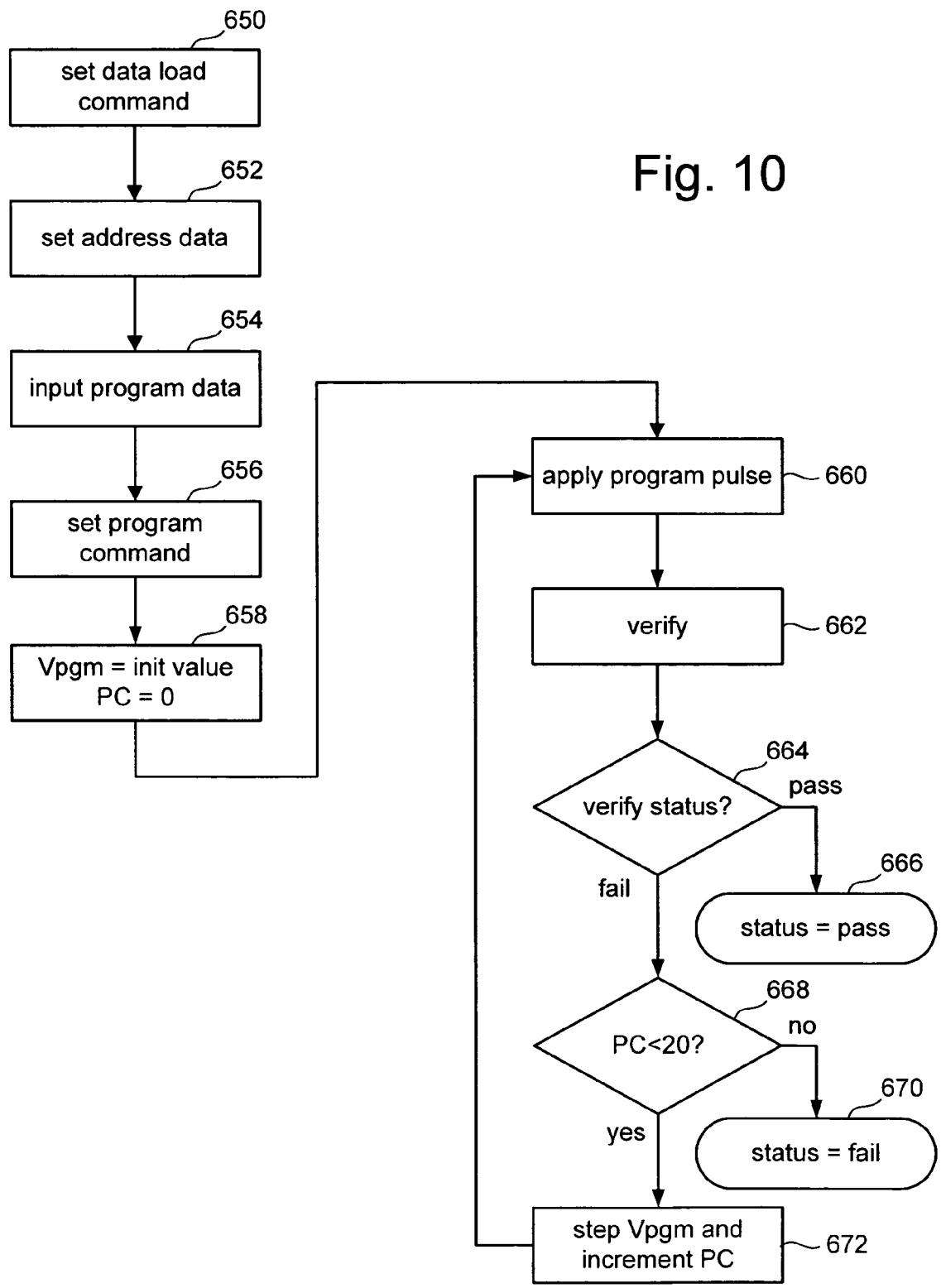
FIG. 10 is a flow chart describing one embodiment of a process for programming non-volatile memory devices.

FIG. 10 is a flowchart describing a method for programming a nonvolatile memory system. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 650 of FIG. 10 (and in reference to FIG. 8), a data load command is issued by controller 518 and input to command circuit 514, allowing data to be input to data input/output buffer 512. The input data is recognized as a command and latched by state machine 516 via a command latch signal, not illustrated, input to command circuits 514. In step 652, address data designating the page address is input to row controller 506 from controller 518. The input data is recognized as the page address and latched via state machine 516, effected by the address latch signal input to command circuits 514. At step 654, 532 bytes of program data are input to data input/output buffer 512. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 656, a program command is issued by controller 318 and input to data input/output buffer 512. The command is latched by state machine 316 via the command latch signal input to command circuits 514

At step 658, Vpgm, the programming pulse voltage level applied to the selected word line, is initialized to the starting pulse (e.g. 12 volts), and a program counter PC maintained by state machine 516, is initialized at 0. At step 660, a program voltage (Vpgm) pulse is applied to the selected word line. The bit lines that include a memory cell to be programmed are grounded to enable programming, while the other bit lines are connected to Vdd to inhibit programming during application of the programming pulse.

At step 662, the states of the selected memory cells are verified. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 362 will be excluded from further programming. At step 664, it is determined whether all cells to be programmed have been verified to have programmed to their corresponding states, such as by checking an appropriate data storage register designed to detect and signal such a status. If so, the programming process is complete and successful because all selected memory cells were programmed and verified to their target states. A status of pass is reported in step 666. If at step 664, it is determined that not all of the memory cells have been so verified, then the programming process continues. At step 668, the program counter PC is checked against a program limit value. One example of a program limit value is 20. If the program counter PC is not less than 20, then the program process is flagged as failed and a status of fail is reported at step 670. If the program counter PC is less than 20, then the Vpgm level is increased by the step size and the program counter PC is incremented at step 672. After step 672, the process loops back to step 660 to apply the next Vpgm program pulse. At the end of a successful program process, the threshold voltages of the memory cells should be within one or more distributions of threshold voltages for programmed memory cells or within a distribution of threshold voltages for erased memory cells.

The flowchart of FIG. 10 depicts a single-pass programming method as can be applied for binary storage. In a two-pass programming method as can be applied for multi-level storage, for example, multiple programming or verification steps may be used in a single iteration of the flowchart. Steps 360-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 11:
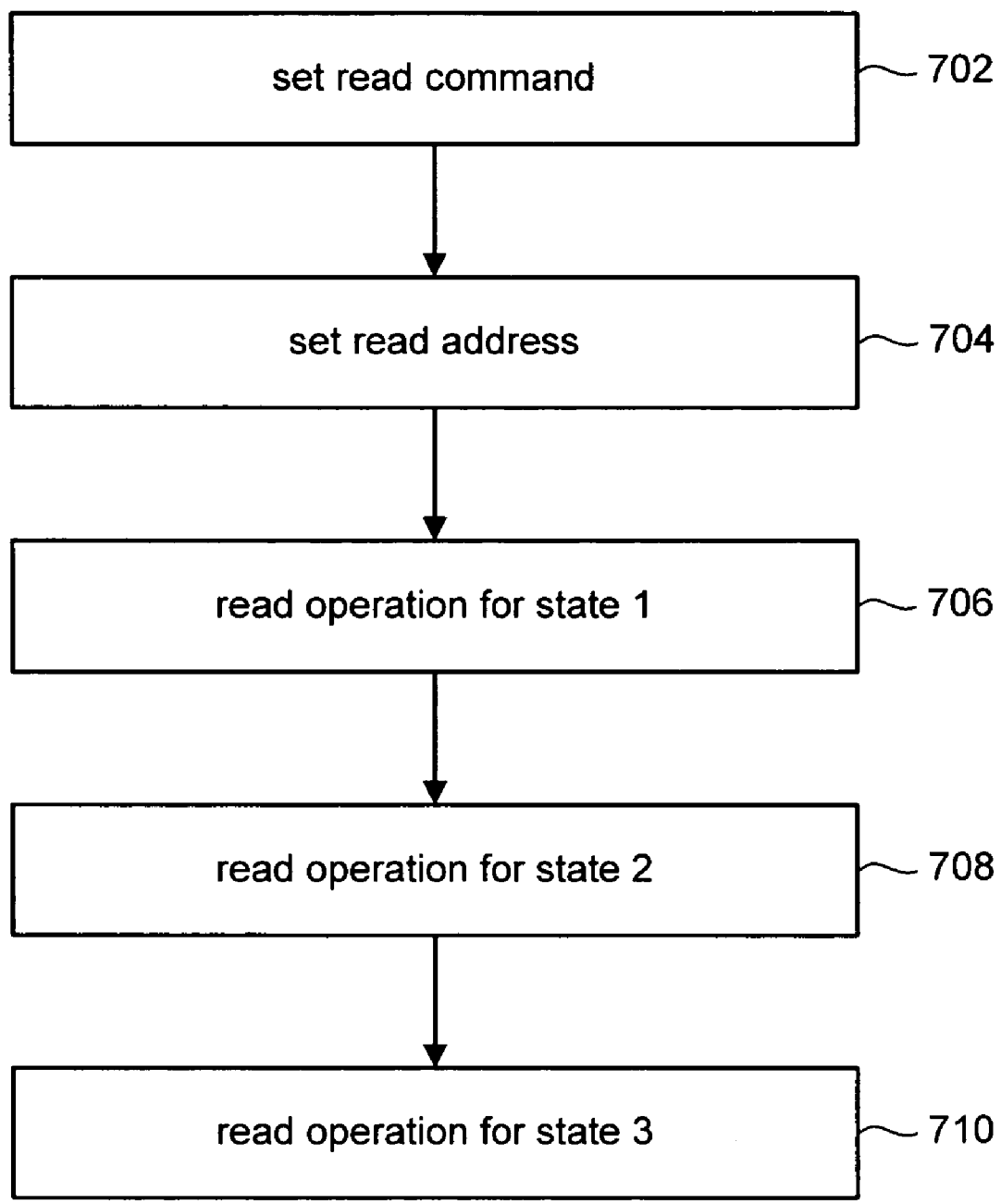
FIG. 11 is a flow chart describing one embodiment of a process for reading non-volatile memory devices.

FIG. 11 is a flow chart describing one embodiment of a process for reading a memory cell in array 502. In step 702, a read command is received from the host and stored in the state machine. In step 704, an address is received and stored. The process of FIG. 13 assumes a four state memory cell, with an erased state and three programmed states. Therefore, in one embodiment, three read operations are performed in order to read the data stored in the memory cell. If the memory has eight states, then seven read operations are performed; if the memory has sixteen states, then fifteen read operations are performed, etc. In step 706, the first read operation is performed. A first read compare point, equivalent to a threshold voltage between state 0 and state 1 is applied to the selected word line, and the sense amplifier on each bit line makes a binary decision as to whether the cell at the intersection of the selected word line and the corresponding bit line is on or off. If the cell is detected to be on, then it is read as being in state 0, otherwise the cell is in state 1, 2 or 3. In other words, if the threshold voltage of the memory cell is greater than the first read compare point, the memory cell is assumed to be in the erased state 0.

In step 708, the second read operation is performed. A second read compare point, equivalent to a threshold voltage between state 2 and state 1 is applied to the selected word line, and the sense amplifier on each bit line makes a binary decision as to whether the cell at the intersection of the selected word line and the corresponding bit line is on or off. An "off" bit line indicate that the corresponding memory cell is either in state 0 or in state 1. An "on" bit line indicates that the corresponding memory cell is in either state 2 or state 3.

In step 710, the third read operation is performed. A third read compare point, equivalent to a threshold voltage between state 3 and state 2 is applied to the selected word line, and the sense amplifier on each bit line makes a binary decision as to whether the cell at the intersection of the selected word line and the corresponding bit line is on or off. An "off" bit line will indicate that the corresponding cell is either in state 0, in state 1, or in state 2. An "on" bit line will indicate that the corresponding memory cell is in state 3. The information obtained during the three sequential steps explained above is stored in latches. A decoder is used to combine the results of the three read operations in order to find the state of each cell. For example, state 1 would be a result of the following three read results: on in step 706, off in step 708, and off in step 710. The above sequence of the read operations can be reversed, corresponding to the verify waveform sequence depicted in FIG. 5. Note that other read processes can also be used with the present invention.

Figure 12:
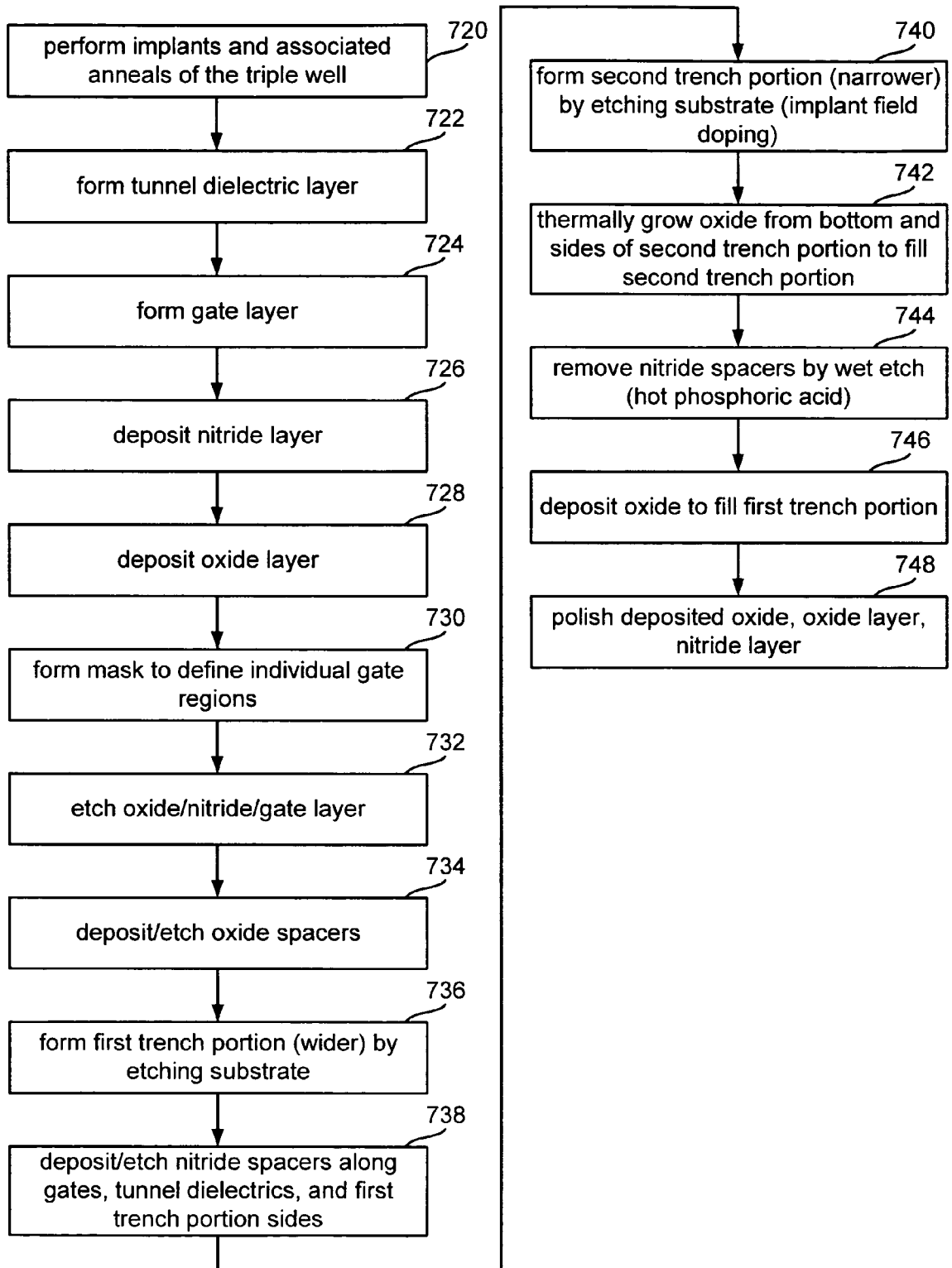
FIG. 12 is flowchart of a method for fabricating MOS devices in accordance with one embodiment.

FIG. 12 is a flowchart of a method for fabricating MOS devices such as PMOS or NMOS transistors in accordance with one embodiment. It will be appreciated that many of the techniques disclosed in FIGS. 6A-7 have equal applicability to the fabrication of MOS devices. Hence, various steps of FIG. 12 can be implemented and performed in the manner previously described with respect to nonvolatile memory. At step 720 implanting and associated annealing of a triple well including the substrate in which the devices are being fabricated is performed. The tunnel dielectric layer (e.g., oxide) is formed on the substrate at step 722.

The gate layer (e.g., metal or other suitably conductive material) for the devices is formed above the dielectric layer at step 724. Step 724 is similar to the formation of the charge storage layer in FIGS. 6A-7. At steps 726 and 728, sacrificial nitride and oxide layers are deposited above the gate layer. The result of steps 720-728 is similar to the devices shown in FIG. 6A, with the charge storage layer 332 being replaced by the gate layer for the MOS devices. A hard mask is deposited over the oxide layer at step 730 and strips of photoresist formed over the areas to become the individual gates for the devices.

Using the photoresist and mask, the oxide layer, nitride layer, and gate layer are etched to define the individual gate regions for each device at step 732. The tunnel dielectric layer in between the photoresist can also be etched at step 732 until the substrate is reached (see FIG. 6B). Oxide sidewall spacers are formed on the sidewalls of each gate region at step 734 (see FIG. 6C). If the dielectric layer was not etched at step 734, it can be etched when etching the oxide to form the sidewall spacers. The sidewall spacers can include multiple layers as previously described.

After successfully forming the individual gate regions, formation of the trench isolation regions is performed in a similar manner to that described for nonvolatile memory devices. The substrate is etched between the oxide spacers at step 736 to form the first trench portions of the trench isolation regions (see FIG. 6D). Nitride is deposited and etched at step 738 to form nitride sidewall spacers on the sidewalls of the first trench portions (see FIG. 6E). The second trench portions are formed at step 740 by etching the substrate at the bottom of the first trench portions in between the nitride sidewall spacers (see FIG. 6F). Filed doping can also be implanted at the bottom of the second trench portions after they have been etched.

An oxide is thermally grown to fill the second trench portions at step 742 (see FIG. 6G). The nitride spacers are removed at step 744 (see FIG. 6H) after growing the oxide and an oxide deposited at step 746 to fill the first trench portions (see FIG. 6I). The deposited oxide, the oxide layer deposited at step 728, and the nitride layer deposited at step 730 are polished at step 748. As with the embodiments described with respect to FIG. 7, step 748 can include polishing any combination of these layers as needed by any particular implementation. Additional steps and processes can be then be performed in accordance with known fabrication techniques to complete an integrated circuit having the trench isolation regions and MOS devices formed according to the disclosed principles.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. An integrated circuit, comprising:
a substrate;
a first portion of a layer formed above said substrate;
a second portion of said layer formed above said substrate; and
a trench isolation region formed in said substrate between said first and second portions of said layer, said trench isolation region including a first trench portion and a second trench portion, said first trench portion including two sidewalls, said second trench portion is at least partially filled with a grown dielectric;
a first sidewall spacer coupled to a first sidewall of said first trench portion;
a second sidewall spacer coupled to a second sidewall of said first trench portion;
said first portion of said layer includes two sidewalls;
said second portion of said layer includes two sidewalls;
said integrated circuit includes a third sidewall spacer formed on a sidewall of said first portion of said layer and a fourth sidewall spacer formed on a sidewall of said second portion of said layer, said third sidewall spacer is adjacent to said fourth sidewall spacer;
said first sidewall spacer is further coupled to said third sidewall spacer; and
said second sidewall spacer is further coupled to said fourth sidewall spacer.

2. The integrated circuit of claim 1, wherein:
said first sidewall spacer and said second sidewall spacer are formed prior to said second trench portion;
said second trench portion is formed by:
etching said substrate at a bottom of said first trench portion between said first sidewall spacer and said second sidewall spacer, and
growing said grown dielectric to at least partially fill said second trench portion.

3. The integrated circuit of claim 1, wherein:
said first portion is a charge storage region for a memory cell of a first NAND string; and
said second portion is a charge storage region for a memory cell of a second NAND string.

4. The integrated circuit of claim 1, wherein:
said first portion of said layer is a gate region of a first MOS transistor; and
said second portion of said layer is a gate region of a second MOS transistor.

5. The integrated circuit of claim 1, wherein:
said integrated circuit includes an array of multi-state flash memory devices.

* * * * *